(12) United States Patent
Disegni

(10) Patent No.: US 11,645,004 B2
(45) Date of Patent: May 9, 2023

(54) REAL-TIME UPDATE METHOD FOR A DIFFERENTIAL MEMORY, DIFFERENTIAL MEMORY AND ELECTRONIC SYSTEM

(71) Applicant: STMicroelectronics S.r.l., Agrate Brianza (IT)

(72) Inventor: Fabio Enrico Carlo Disegni, Spino d'adda (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/667,087

(22) Filed: Feb. 8, 2022

(65) Prior Publication Data

US 2022/0164131 A1 May 26, 2022

Related U.S. Application Data

(63) Continuation of application No. 17/087,070, filed on Nov. 2, 2020, now Pat. No. 11,256,442, which is a continuation-in-part of application No. 16/225,557, filed on Dec. 19, 2018, now Pat. No. 10,824,417.

(30) Foreign Application Priority Data

Jan. 5, 2018  (IT) .......................... 102018000000580

(51) Int. Cl.
*G06F 3/06* (2006.01)
(52) U.S. Cl.
CPC .......... *G06F 3/0655* (2013.01); *G06F 3/0604* (2013.01); *G06F 3/0679* (2013.01)

(58) Field of Classification Search
None
See application file for complete search history.

(56) References Cited

U.S. PATENT DOCUMENTS

| 4,292,676 | A | 9/1981 | Henig |
| 5,950,224 | A | 9/1999 | Devin |
| 6,151,236 | A | 11/2000 | Bondurant et al. |
| 2008/0043512 | A1 | 2/2008 | Fukushi |
| 2008/0170431 | A1 | 7/2008 | Sheu et al. |
| 2015/0339069 | A1 | 11/2015 | Nishikubo et al. |

(Continued)

FOREIGN PATENT DOCUMENTS

| DE | 102016214879 A1 | 2/2018 |
| WO | 2008058101 A2 | 5/2008 |
| WO | 2016196835 A1 | 12/2016 |

*Primary Examiner* — Qing Chen
(74) *Attorney, Agent, or Firm* — Slater Matsil, LLP

(57) ABSTRACT

A method for operating a differential memory includes: operating a main memory module differentially while executing a first program; copying first logic data from a first submodule of the main memory module to an auxiliary memory module; storing third logic data associated with a second program in a second submodule of the main memory module by overwriting second logic data associated with the first program, while maintaining the first logic data contained in the first submodule of the main memory module unaltered, where the second logic data are complementary to the first logic data; when a request for reading the first logic data is received during the storing of the third logic data in the second submodule of the main memory module, reading the first logic data from the auxiliary memory module; and executing the first or second programs by operating the main memory module in single-ended mode.

20 Claims, 18 Drawing Sheets

(56) References Cited

U.S. PATENT DOCUMENTS

| | | |
|---|---|---|
| 2016/0358640 A1 | 12/2016 | Brederlow et al. |
| 2018/0166131 A1 | 6/2018 | Chen et al. |
| 2019/0213000 A1 | 7/2019 | Disegni |
| 2019/0214083 A1 | 7/2019 | Disegni |

REAL-TIME UPDATE METHOD FOR A DIFFERENTIAL MEMORY, DIFFERENTIAL MEMORY AND ELECTRONIC SYSTEM

CROSS-REFERENCE TO RELATED APPLICATIONS

This application is a continuation of U.S. patent application Ser. No. 17/087,070 (now U.S. Pat. No. 11,256,442), filed on Nov. 2, 2020, which is a continuation-in-part of U.S. patent application Ser. No. 16/225,557 (now U.S. Pat. No. 10,824,417), filed on Dec. 19, 2018, which claims the benefit of Italian Application No. 102018000000580, filed on Jan. 5, 2018, which applications are hereby incorporated herein by reference.

U.S. patent application Ser. No. 16/225,557 (now U.S. Pat. No. 10,824,417) was filed concurrently with U.S. patent application Ser. No. 16/225,492 (now U.S. Pat. No. 10,811,093), which claims the benefit of Italian Application No. 102018000000581, filed on Jan. 5, 2018, which applications are hereby incorporated herein by reference.

TECHNICAL FIELD

The present invention relates generally to an electronic system and method, and, in particular embodiments, to a real-time update method for a differential memory, differential memory and electronic system.

BACKGROUND

As is known, electronic control units of vehicles include a memory designed to store a vehicle-control software.

Further known is the need to test a number of versions of the software and thus alternate execution of different versions until a final version is selected.

It is common practice to use a plurality of memories, each memory being designed to store each version of the software to be tested. Alternatively, it is possible to use a memory of a size such as to store each version of the software to be tested. This entails an increase in the costs.

The above problem is particularly felt in the case of use of memories of a differential type, where two memory cells of opposite state are associated to each information bit. Reading architectures of a differential type afford advantages in terms of reliability, in so far as the datum is stored in a redundant way; reading is carried out by comparing the data contained in the two memory cells of opposite state.

A class of memory of a differential type is the phase-change memory (PCM), where, in particular, reading is made by comparing respective currents that flow in the cells associated to a same information bit.

As is known, nonvolatile phase-change memories (PCMs) represent a generation of integrated memories where storage of information is obtained by exploiting phase-change materials, which have the property of being able to switch between phases that have electrical resistivities of considerably different value. In particular, these materials may switch between an amorphous phase, with high resistivity, and a crystalline or polycrystalline phase, with low resistivity. Consequently, in a phase-change memory cell it is possible to associate a different value of a datum stored in the cell to a respective phase of a memory element of the cell.

For instance, it is possible to use elements of group VI of the periodic table, such as tellurium (Te), selenium (Se), or antimony (Sb), which are referred to as "chalcogenides" or "chalcogenic materials" to form phase-change memory elements. In particular, an alloy made up of germanium (Ge), antimony (Sb), and tellurium (Te), known as GST (having chemical composition $Ge_2Sb_2Te_5$) currently finds wide use in such memory elements.

Phase switching in a memory element may be obtained by locally increasing the temperature of the region of chalcogenic material, for example by causing passage of a programming electric current through resistive electrodes (generally known as "heaters") arranged in contact with the region of chalcogenic material. The electric current, by the Joule effect, generates the temperature profile necessary for phase change. In particular, when the chalcogenic material is in the amorphous state, with high resistivity (the so-called RESET state), it is necessary to apply a first current pulse (the so-called SET pulse) of a duration and amplitude such as to enable the chalcogenic material to cool slowly. Subjected to this treatment, the chalcogenic material changes state and switches from the high-resistivity state to a low-resistivity crystalline state (the so-called SET state). Conversely, when the chalcogenic material is in the SET state, it is necessary to apply a second current pulse (the so-called RESET pulse) of large amplitude and short duration so as to cause the chalcogenic material to return into the high-resistivity amorphous state.

In PCM circuits of a known type, reading of the datum stored in a memory cell may be carried out by applying to the memory element of chalcogenic material a voltage sufficiently low as not to cause a sensible heating thereof, and then by reading the value of the current flowing in the memory cell. Given that the current is proportional to the conductivity of the chalcogenic material, it is possible to determine in which phase the material is, and thus arrive at the datum stored in the memory cell.

In a known way, PCMs of a differential type are typically designed according to a scheme with an array of memory cells arranged in rows (word lines) and columns (bit lines). Each memory cell is provided by a phase-change storage element and by a selector transistor, connected in series. A column decoder and a row decoder enable, on the basis of address logic signals received at input and more or less complex decoding schemes, selection of the memory cells, and in particular of the corresponding word lines and bit lines, each time addressed.

The column decoder comprises a plurality of analog selection switches (implemented with transistors), which receive on their respective control terminals the address signals. The selection switches are arranged according to a tree structure in hierarchical levels, and their number in each hierarchical level is linked to the arrangement and size of the memory array. The selection switches, once enabled, make it possible to bring the bit line selected to a definite value of voltage and/or current, according to the operations that are to be implemented. In particular, a current path is created between a programming stage or a reading stage and the bit line selected. The current path is defined by the series of a certain number of selection switches.

In a known way, sense amplifiers carry out reading of the data stored in the memory cells, comparing the current that flows in the memory cell selected (or an electrical quantity correlated thereto) with a reference current supplied by a reference-current generator (single-ended reading) and/or by one or more reference cells, used for the entire memory array. Single-ended reading is typically used during verification that programming of the cell has occurred or during testing. During normal use of the memory, reading of a double-ended (differential) type is instead adopted, where the sense amplifiers compare the current flowing in the memory cell selected with the current flowing in a respective cell associated to the memory cell selected in the differential architecture.

To carry out single-ended reading, one input of the sense amplifier receives the current of the memory cell that is to be read, whereas the other input of the sense amplifier receives the reference current supplied by the reference-current generator.

Reading architectures for PCMs of a differential type afford advantages in terms of reliability in so far as the datum is stored in a redundant way and further they do not require generation of a reference current, in so far as reading is carried out by simply comparing the respective currents that flow in the cells associated to a same bit.

In single-ended mode, it is possible to read and write independently two memory cells that are normally associated for carrying out differential reading. In effect, when it is operated in single-ended mode, each memory cell may have a value independent of the value of the other memory cells, and it is consequently possible to double the amount of data that may be stored in the PCM.

A drawback of the PCM devices used in single-ended mode lies in the fact that in single ended mode the degradation over time of the logic data stored may not be compensated and, in the absence of periodic refresh operations, the associated information is lost. Instead, when PCMs are used in double-ended mode, all the logic data undergo in time common-mode degradation and, consequently, via differential reading, it is in any case possible to arrive at the desired information content, cancelling out the offset due to common-mode degradation.

In order to prevent any loss of data in a memory cell, albeit continuing to use the single-ended mode, it is expedient to refresh the memory cell periodically. Refresh methods are known for architectures based upon fast-writing technology, such as the dynamic random-access memory (DRAM), where the time necessary for each writing operation is of the order of nanoseconds. In these methods, the datum to be refreshed is read and overwritten periodically before it gets lost.

Conversely, in PCM technologies of a known type, the duration of a writing operation is in the region of several microseconds, typically 10 microseconds. Consequently, it would not be possible to update entire memory banks if used for applications that require real-time access to the memory (in reading and/or writing).

SUMMARY

Some embodiments relate to a method for managing a differential memory, a differential memory, and a system that comprises the differential memory. Some embodiments relate to a method for real-time updating of a differential memory with continuous reading accessibility by a user.

In an embodiment, a method for real-time management of a differential memory includes: storing first logic data associated with a first informative content in an auxiliary memory module of the differential memory, the first logic data being stored in a first submodule of a main memory module; storing third logic data associated with a second informative content in a second submodule of the main memory module of the differential memory by overwriting second logic data associated with the first informative content, while maintaining the first logic data contained in the first submodule of the main memory module unaltered, where the second logic data are complementary to the first logic data; receiving a request for reading the first informative content; when the third logic data is being stored, reading the first logic data from the auxiliary memory module in a single-ended mode in response to the request for reading the first informative content; when the third logic data is not being stored, reading the first logic data from the first submodule in response to the request for reading the first informative content; receiving a request for reading the second informative content; and reading the third logic data in single-ended mode in response to the request for reading the second informative content.

In another embodiment, a differential memory includes: a first submodule configured to store first logic data and a second submodule configured to store second logic data that is complementary to the first logic data; an auxiliary memory module; and a controller configured to: control a storage operation of the first logic data in the auxiliary memory module; control a storage operation of third logic data, associated with a second informative content, in the second submodule by overwriting the second logic data while maintaining the first logic data contained in the first submodule unaltered; receive a request for reading the first informative content; when the third logic data is being stored, read the first logic data from the auxiliary memory module in single-ended mode in response to the request for reading the first informative content; when the third logic data is not being stored, read the first logic data from the first submodule in response to the request for reading the first informative content; receive a request for reading the second informative content; and read the third logic data in single-ended mode in response to the request for reading the second informative content.

In yet another embodiment, a differential memory includes: a first main memory module including a first submodule configured to store first logic data and a second submodule configured to store second logic data that is complementary to the first logic data, the first and second submodules being the same size; an auxiliary memory module; and a controller configured to: read and rewrite the first logic data in the first submodule; control a storage operation of the first logic data in the auxiliary memory module; control a storage operation of third logic data, associated with a second informative content, in the second submodule by overwriting the second logic data while maintaining the first logic data contained in the first submodule unaltered; receive a request for reading the first informative content; when the third logic data is being stored, read the first logic data from the auxiliary memory module in single-ended mode in response to the request for reading the first informative content; when the third logic data is not being stored, read the first logic data from the first submodule in response to the request for reading the first informative content; receive a request for reading the second informative content; and read the third logic data in single-ended mode in response to the request for reading the second informative content.

In yet another embodiment, a method for managing a PCM differential memory that is arranged in two branches and configured to enable differential reading of a first informative content stored in complementary form in the two branches includes the steps of: storing a second informative content in one of the two branches, preserving the data regarding the first informative content in the other branch; using an auxiliary module for temporarily storing the first informative content, and enabling storage of the second informative content without interrupting access in reading to the first informative content; and reading in asymmetrical, or single-ended, mode the first or second informative content.

Some embodiments provide a management method of real-time access to a differential memory operated in single-ended mode, a differential memory that may be operated in single-ended mode, and an electronic system including the differential memory that will be able to overcome the drawbacks of the prior art.

In some embodiments, the differential memory is a phase-change memory. In some embodiments, the differential memory may be operated in single-ended mode, i.e., accessing twice the number of address spaces with respect to differential memories of conventional use.

According to an embodiment, a differential memory, such as a phase-change memory, includes a first main memory module, which stores first logic data to be refreshed, and an auxiliary memory module. In some embodiments, the differential memory is operated in single-ended mode. In some embodiments, the differential memory is operated by storing second logic data in the auxiliary memory module, copying the first logic data; refreshing the first logic data; and fetching, in response to a request for reading the first logic data, the second logic data during the step of refresh of the first logic data, and fetching the first logic data, otherwise.

BRIEF DESCRIPTION OF THE DRAWINGS

For a better understanding of the present invention, preferred embodiments thereof are now described, purely by way of non-limiting example, with reference to the attached drawings, wherein.

DETAILED DESCRIPTION OF ILLUSTRATIVE EMBODIMENTS

Figure 1:
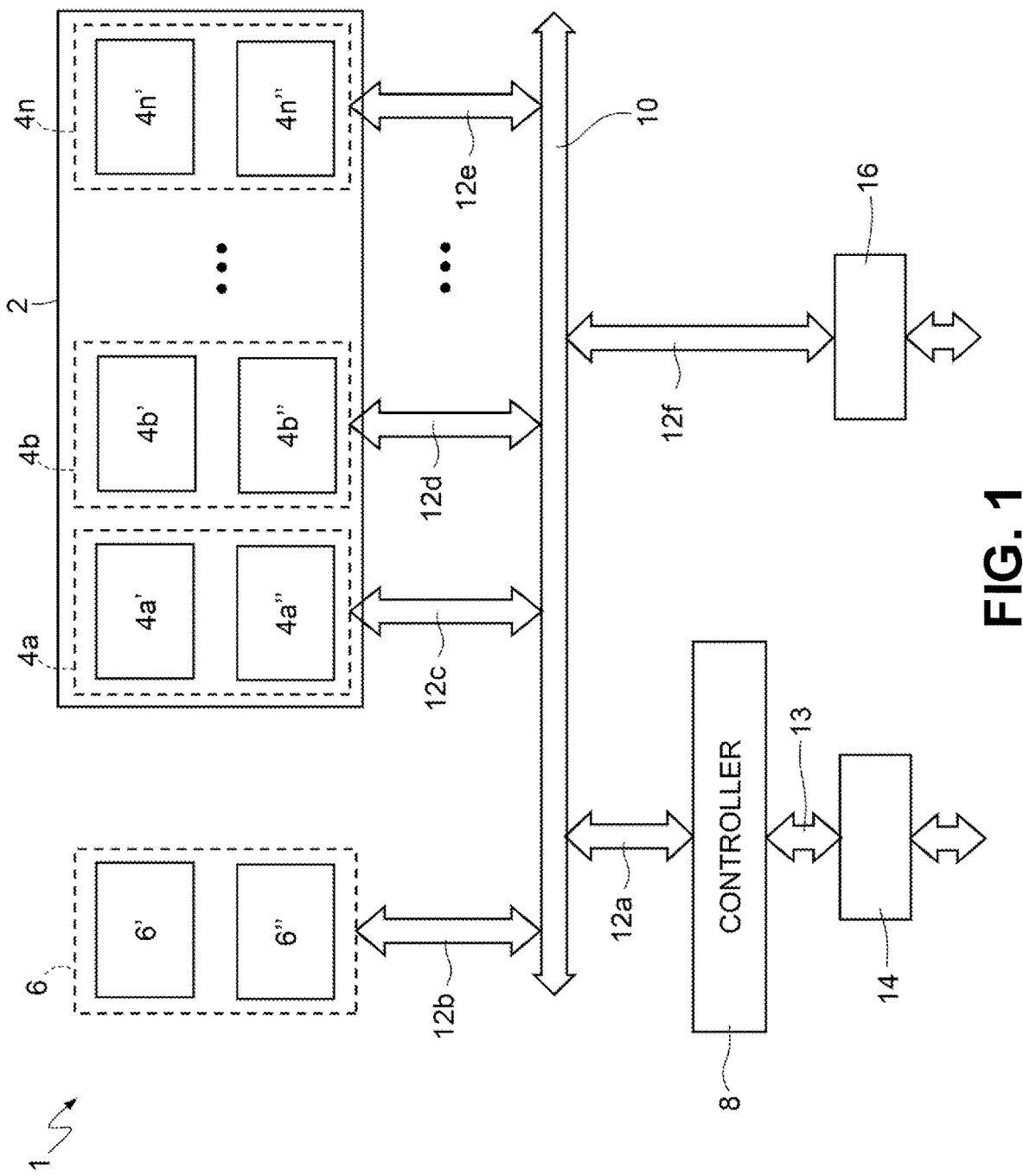
FIG. 1 is a schematic illustration of a portion of a nonvolatile memory device according to an embodiment of the present invention.

Represented schematically in FIG. 1 and designated as a whole by the reference number 1 is a portion of a memory device, in particular a nonvolatile memory. According to an embodiment of the present invention, the memory 1 is of a differential type, in particular of a PCM type. The nonvolatile-memory device 1 is shown limitedly to just the parts necessary for an understanding of the present disclosure.

In a known way, phase-change memories (PCMs) of a differential type are typically designed according to a scheme with an array of memory cells arranged in rows (word lines) and columns (bit lines). Each memory cell is provided by a phase-change storage element and by a selector transistor, connected in series. A column decoder and a row decoder enable selection, on the basis of address logic signals received at input and more or less complex decoding schemes, of the memory cells, and, in particular, the corresponding word lines and bit lines, each time addressed.

The column decoder comprises a plurality of analog selection switches (provided by transistors), which receive at their respective control terminals the address signals. The selection switches are arranged according to a tree structure in hierarchical levels, and their number at each hierarchical level is linked to the arrangement and size of the memory array. The selection switches, when enabled, make it possible to bring the bit line selected to a definite value of voltage and/or current, according to the operations that it is desired to implement. In particular, a current path is created between a programming stage or a reading stage and the bit line selected. This current path is defined by the series of a certain number of selection switches. In a known way, sense amplifiers carry out reading of the data stored in the memory cells, comparing the current that flows in the memory cell selected (or an electrical quantity correlated thereto) with a reference current supplied by a reference-current generator (so-called asymmetrical or single-ended reading) and/or by one or more reference cells, used for the entire memory array. In the prior art, single-ended reading is typically used during verification that programming of the cell has occurred or during testing. During normal use of the memory, reading of a double-ended type is instead used, in which the sense amplifiers compare the current flowing in the memory cell selected with the current flowing in a respective cell associated to the memory cell selected in the differential architecture.

To carry out single-ended reading, an input of the sense amplifier receives the current of the memory cell that is to be read, while the other input of the sense amplifier receives the reference current supplied by the reference-current generator.

In single-ended mode, it is possible to read and write independently two memory cells that are normally associated in order to carry out differential reading. In effect, when it is operated in single-ended mode, each memory cell may have a value independent of the value of the other memory cells, and it is consequently possible to double the amount of data that may be stored in the PCM.

In particular, the nonvolatile-memory device 1 comprises a memory array 2, constituted by a plurality of "n" main memory modules 4a-4n. Each main memory module 4a-4n comprises a first submodule 4a'-4n' and a second submodule 4a"-4n". In particular, each first submodule 4a'-4n' comprises a plurality of memory cells, and each second submodule 4a"-4n" comprises a plurality of respective memory cells.

In a per se known manner and not shown in FIG. 1, the plurality of first memory cells stores respective logic data of a binary type. The plurality of second memory cells corresponds, as regards number and manufacturing characteristics, to the plurality of first memory cells and is configured to store respective logic data complementary to the logic data stored in the respective plurality of first memory cells so as to enable differential reading of the logic data.

In any case, each main memory module 4a-4n may be used, in addition to differential mode, in single-ended mode, such that the logic data stored in the plurality of memory cells of each second submodule 4a"-4n" are not complementary to the logic data stored in the plurality of memory cells of the respective first submodule 4a'-4n', but are further information data. In this way, it is possible to double the total capacity of the memory array 2.

The nonvolatile-memory device 1 further comprises an auxiliary memory module 6. In particular, the auxiliary memory module 6 structurally and operatively corresponds to each main memory module 4a-4n, and is thus formed by a first submodule 6' and a second submodule 6". In particular, the first submodule 6' comprises a plurality of memory cells, and the second submodule 6" comprises a plurality of respective memory cells, which may be addressed and thus may be used in single-ended mode.

In addition, the nonvolatile-memory device 1 comprises a controller 8, operatively coupled to the memory array 2 and to the auxiliary memory module 6. The controller 8 is configured to implement a method of reading and writing logic data in the memory array 2 and in the auxiliary memory module 6.

Furthermore, the nonvolatile-memory device 1 comprises a bus 10. The controller 8, the main memory modules 4a-4n, and the auxiliary memory module 6 are each coupled to the bus 10 by respective communication lines 12a-12e so as to enable, as described in greater detail hereinafter, a transfer of data and control signals between the controller 8, the main memory modules 4a-4n, and the auxiliary memory module 6.

Further, the nonvolatile-memory device 1 comprises a controller interface 14. The controller interface 14 is coupled to the controller 8 so as to send to the controller 8, via a communication line 13, logic data to be written in the memory array 2.

In addition, the nonvolatile-memory device 1 comprises a memory-array interface 16. The memory-array interface 16 is coupled to the bus 10 via a respective communication line 12f. A user of the nonvolatile-memory device 1 may gain access, for example in reading, to the data stored in the nonvolatile-memory device 1 via the memory-array interface 16. The user is, for example, a microprocessor, a DSP, or a microcontroller.

Figure 2:
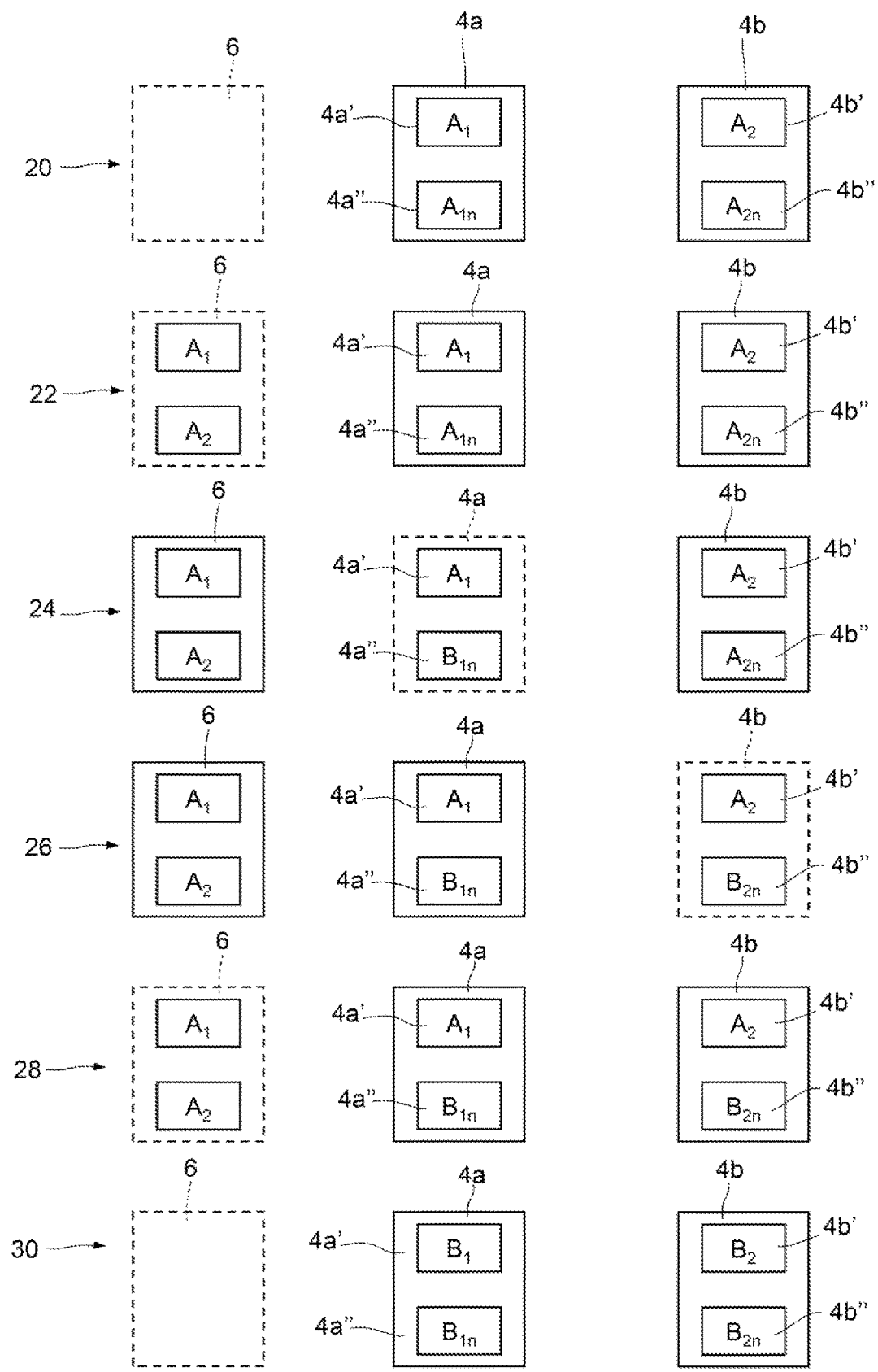
FIG. 2 shows schematically, by a block diagram, a method for managing the nonvolatile-memory device of FIG. 1, according to an embodiment of the present invention.

FIG. 2 shows schematically, by a block diagram, a method for managing the memory array 2. In particular, by way non-limiting example, FIG. 2 regards a memory array 2 in which a first main memory module 4a and a second main memory module 4b are present. In other embodiments, the number of main memory modules could be different.

In an initial step 20, the memory array 2 contains a first set of data A, stored in a differential way. In particular, the first set of data A includes a first datum A1, a second datum A2, and the respective complementary data A1n, A2n. For instance, each of the first and second data A1, A2 and the respective complementary data A1n, A2n is a single bit or a set of bits having a size, for example, of 32 MB.

In particular, the first main memory module 4a contains the first datum A1 and the respective complementary datum A1n, and the second main memory module 4b comprises the second datum A2 and the respective complementary datum A2n. In particular, the first datum A1 is stored in the first submodule 4a' of the first main memory module 4a; the second datum A2 is stored in the first submodule 4b' of the second main memory module 4b; the datum A1n complementary to the first datum A1 is stored in the second submodule 4a" of the first main memory module 4a; the datum A2n complementary to the second datum A2 is stored in the second submodule 4b" of the second main memory module 4b.

In the initial step 20, the user of the nonvolatile-memory device 1 has access to the first set of data A, which may be read in a differential way from the first and second main memory modules 4a, 4b.

The contents of the auxiliary memory block 6, which is represented empty in FIG. 2, are irrelevant in the initial step 20 of the management method. The user of the nonvolatile-memory device 1 does not have access to the data stored in the auxiliary memory block 6, which is for this reason illustrated with a dashed line.

After step 20, control passes to step 22 where each of the first and second data A1, A2 is written in the auxiliary memory module 6 by the controller 8, as described in detail hereinafter.

During step 22, the user of the nonvolatile-memory device 1 continues to have access to the first set of data A, which may be read in a differential way from the first and second main memory modules 4a, 4b.

After step 22, control passes to steps of writing a second set of data B in the first and second main memory modules 4a, 4b.

In particular, the second set of data B includes a first datum B1n and a second datum B2n. For instance, in a way similar to what has been described with reference to the first set of data A, each of the first and second data B1n, B2n is a single bit or a set of bits having a size, for example, of 32 MB.

In particular, after step 22 control passes to step 24, where the datum B1n is written in the second submodule 4a" of the first main memory module 4a.

During step 24, the contents of the first main memory module 4a are not accessible in reading for the user in so far as the module is occupied in the operation of writing of the datum B1n. For this reason, it is illustrated with a dashed line.

In any case, during step 24, the user of the nonvolatile-memory device 1 continues to have access to the informative content associated to the first set of data A in so far as it is possible to read the first datum A1 in the auxiliary memory module 6, and the second datum A2 in the second main memory module 4b.

After step 24 control passes to step 26, where the datum B2n is written in the second submodule 4b" of the second main memory module 4b.

During step 26, the contents of the second main memory module 4b are not accessible in reading in so far as the module is occupied in the operation of writing of the datum B2n. For this reason, it is illustrated with a dashed line.

In any case, during step 26, the user of the nonvolatile-memory device 1 continues to have access to the informative content associated to the first set of data A in so far as it is possible to read the first datum A1 in the first main memory module 4a and the second datum A2 in the auxiliary memory module 6.

After step 26, control passes to step 28, where the second main memory module 4b is rendered again accessible to the user. During step 28, the contents of the auxiliary memory module 6 are not accessible and are irrelevant, and for this reason the module is illustrated with a dashed line.

During step 28, the user of the nonvolatile-memory device 1 continues to have access to the informative content associated to the first set of data A in so far as it is possible to read the first datum A1 in the first main memory module 4a and the second data A2 in the second main memory module 4b.

During step 28, the user of the nonvolatile-memory device 1 has further access to the informative content associated to the second set of data B in so far as it is possible to read the datum Bin in the first main memory module 4a and the datum B2n in the second main memory module 4b.

For instance, the informative content associated to the first set of data A is a first vehicle-control software. In this case, the nonvolatile-memory device 1 is embedded in an electronic control unit of the vehicle. In addition, the informative content associated to the second set of data B is a second vehicle-control software.

During step 28, it is possible to carry out alternatively the first or second vehicle-control software.

For instance, during step 28 it is possible to evaluate the performance of the vehicle during use of the first control software, and alternately, of the second control software, until the most adequate control software is determined.

Once step 28 is through, control passes to step 30, where the control software deemed adequate is stored in a differential way in the memory array 2. For instance, in the case of FIG. 2, the control software deemed adequate is that associated to the second set of data B.

Consequently, after step 28, a datum B1 complementary to the datum Bin is written in the first submodule 4a' of the first main memory module 4a, and a datum B2 complementary to the datum Ben is written in the first submodule 4b' of the second main memory module 4b, to arrive at the configuration illustrated in step 30. The auxiliary memory module 6 is shown with a dashed line, in so far as, at the end of the steps of the method described previously, the auxiliary memory module 6 is not used and its informative content is irrelevant.

The steps 22-26 of the management method are carried out for all "n" main memory modules 4a-4n, as illustrated previously for the case of the two main memory modules 4a, 4b.

Figure 3:
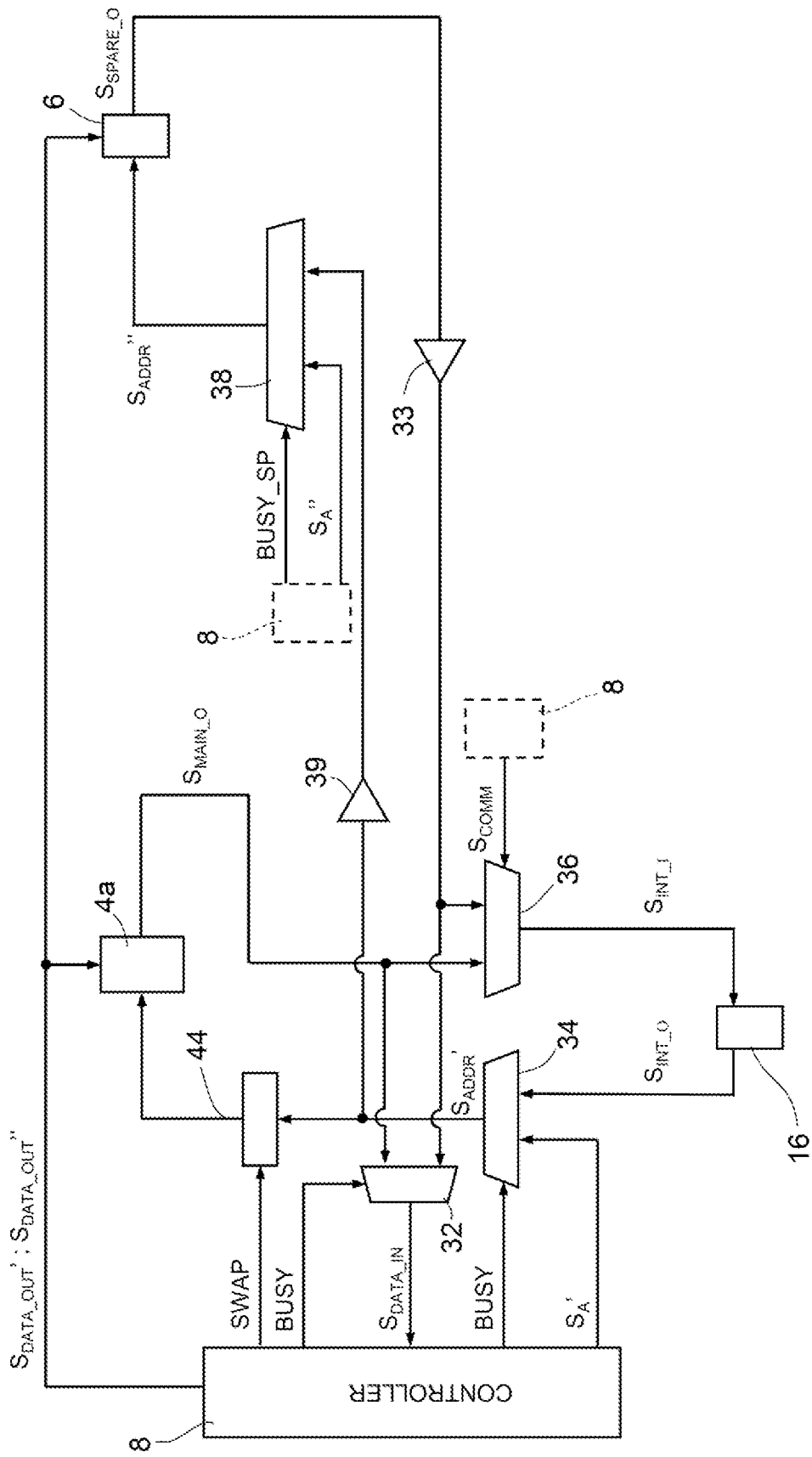
FIG. 3 shows an electrical circuit corresponding to a portion of the nonvolatile-memory device of FIG. 1, included in the portion of FIG. 1, according to an embodiment of the present invention.

FIG. 3 shows in greater detail a portion of the nonvolatile-memory device 1 of FIG. 1, comprising the main memory module 4a, the auxiliary memory module 6, the controller 8, and the memory-array interface 16, according to an embodiment of the present invention. In particular, the nonvolatile-memory device 1 further comprises a plurality of multiplexers designed to render transparent management of the first and second sets of data A, B for the user of the nonvolatile-memory device 1.

The controller 8 is further configured to generate a first control signal BUSY, a second control signal BUSY_SP, and a third control signal $S_{COMM}$ for controlling the plurality of multiplexers described more fully hereinafter.

The controller 8 is further configured to receive data contained in the main memory module 4a and in the auxiliary memory module 6 via an input signal $S_{DATA\_IN}$. In particular, the signal $S_{DATA\_IN}$ is one of the signals $S_{MAIN\_O}$ (which carries the data contained in the main memory module 4a) and $S_{SPARE\_O}$ (which carries the data contained in the auxiliary memory module 6) selected via a multiplexer 32 controlled by the first control signal BUSY. For this purpose, the multiplexer 32 is coupled to the main memory module 4a and to the auxiliary memory module 6 for receiving, respectively, the signal $S_{MAIN\_O}$ and the signal $S_{SPARE\_O}$. For instance, the signal $S_{SPARE\_O}$ is read after an operation of writing in the auxiliary memory module 6 in order to verify that the writing operation has been carried out correctly. Otherwise, according to known procedures, subsequent writing operations of the same datum are carried out until the datum has been written correctly.

In particular, the multiplexer 32 is coupled to the auxiliary memory module 6 via interposition of a first buffer 33 so as to reduce the propagation times associated to the auxiliary memory module 6.

The controller 8 is further configured to send to the main memory module 4a an output signal $S_{DATA\_OUT}'$ that carries data that may be stored in the main memory module 4a, and to send to the auxiliary memory module 6 an output signal $S_{DATA\_OUT}''$ that carries data that may be stored in the auxiliary memory module 6.

The controller 8 is further configured to generate a signal $S_A'$, which contains an address of one of the memory cells of the main memory module 4a. The signal $S_A'$ is supplied to an input of a multiplexer 34 controlled by the first control signal BUSY. The multiplexer 34 further receives a signal $S_{INT\_O}$ from the memory-array interface 16, which contains an address for carrying out an operation of reading or writing on one of the memory cells of the main memory module 4a. The first control signal BUSY enables selection of one of the input signals $S_A'$, $S_{INT\_O}$ in order to generate an output signal $S_{ADDR}'$ to the multiplexer 34.

The signal $S_{ADDR}'$ is supplied to the main memory module 4a for addressing one of the memory cells of the main memory module 4a.

According to one aspect of the present invention, an address-management block 44 is arranged between the multiplexer 34 and the main memory module 4a. The controller 8 is further configured to generate a control signal SWAP, designed to control the address-management block 44. Consequently, the address-management block 44 receives at input the signal $S_{ADDR}'$ and the control signal SWAP. In particular, if the control signal SWAP has logic value "0," the signal $S_{ADDR}'$ is directly supplied to the main memory module 4a. Otherwise, if the control signal SWAP has logic value "1," the signal $S_{ADDR}'$ is modified so as to address the memory cell complementary to the memory cell originally addresses. Typically, in differential memories, the address of a memory cell and that of its complementary are separated by a fixed offset equal to the size of the memory cell. In this case, the address-management block 44 is configured to add the offset to the address indicated by the signal $S_{ADDR}'$ in the case where the control signal SWAP has logic value "1."

Consequently, the signal $S_{MAIN\_O}$ at output from the main memory module 4a contains data corresponding to the data contained in the memory cell, addressed by the signal $S_{ADDR}'$, of the main memory module 4a if the control signal SWAP has logic value "0," or alternatively the data contained in the complementary memory cell if the control signal SWAP has logic value "1." In this way, it is possible to access, during step 28 of the management method, both the informative content associated to the set of data A and to that associated to the set of data B. In addition, it is possible to execute each of the control software corresponding to the set of data A and to the set of data B with reference to a same memory-address region, namely, the one for which each of the control software has been compiled and linked even though the set of data B physically resides in a different memory-address region.

The aforesaid signal $S_{MAIN\_O}$ is further supplied to a multiplexer 36 controlled by the third control signal $S_{COMM}$. The multiplexer 38 further receives at input the signal $S_{SPARE\_O}$ from the auxiliary memory module 6 via interposition of the first buffer 33. The multiplexer 38 selects one of the signals $S_{MAIN\_O}$, $S_{SPARE\_O}$ in order to generate a signal $S_{INT\_I}$ at input to the memory-array interface 16. The signal $S_{INT\_I}$ consequently contains data sent in response to reading requests from the user. These data come from the main memory module 4a or from the auxiliary memory module 6.

The controller 8 is further configured to generate a signal $S_A''$, which contains an address of one of the memory cells of the auxiliary memory module 6. The signal $S_A''$ is supplied to an input of a multiplexer 38 controlled by the second control signal BUSY_SP. The multiplexer 38 further receives at input the signal $S_{ADDR}'$ via interposition of a second buffer 39 so as to reduce the propagation times associated to the auxiliary memory module 6. The second control signal BUSY_SP enables selection of one of the input signals $S_A''$, $S_{ADDR}'$ for generating a signal $S_{ADDR}''$ at output from the multiplexer 38. In particular, the output signal $S_{ADDR}''$ corresponds to the input signal $S_A''$ during copying of the data of the main memory module 4a into the auxiliary memory module 6 (step 22 of the management method of FIG. 2), and to the input signal $S_{ADDR}'=S_{INT\_O}$ in the case where the user requests reading of the informative content of the memory cell 4a during writing of the datum Bin in the main memory module 4a (step 24 of the management method of FIG. 2).

In a per se known manner, the controller 8 and the main memory module 4a receive at input respective clock signals generated by clock generators not shown in FIG. 3. Further, a multiplexer (not shown in the figure either) may be arranged between the main memory module 4a and the aforesaid clock generators for synchronizing the main memory module 4a to the controller 8.

It is evident that the second main memory module 4b is structurally equivalent to the first main memory module 4a of FIG. 3, and is operatively coupled to the controller 8, to the auxiliary memory module 6, and to the memory-array interface 16 via respective multiplexers.

In addition, the second main memory module 4b may be associated to a respective clock signal, for example different from the clock signal of the first main memory module 4a.

In order to describe in greater detail some steps of the management method FIG. 2, each of FIGS. 4A-4E shows the portion of the nonvolatile-memory device 1 of FIG. 3 during a different step of the method, according to an embodiment of the present invention. In each of FIGS. 4A-4E, communication lines corresponding to signals that are active in the corresponding step of the method are highlighted with the use of thick lines, where by "active signals" are meant signals that carry data during this step and signals that carry addresses of the data.

Figure 4A:
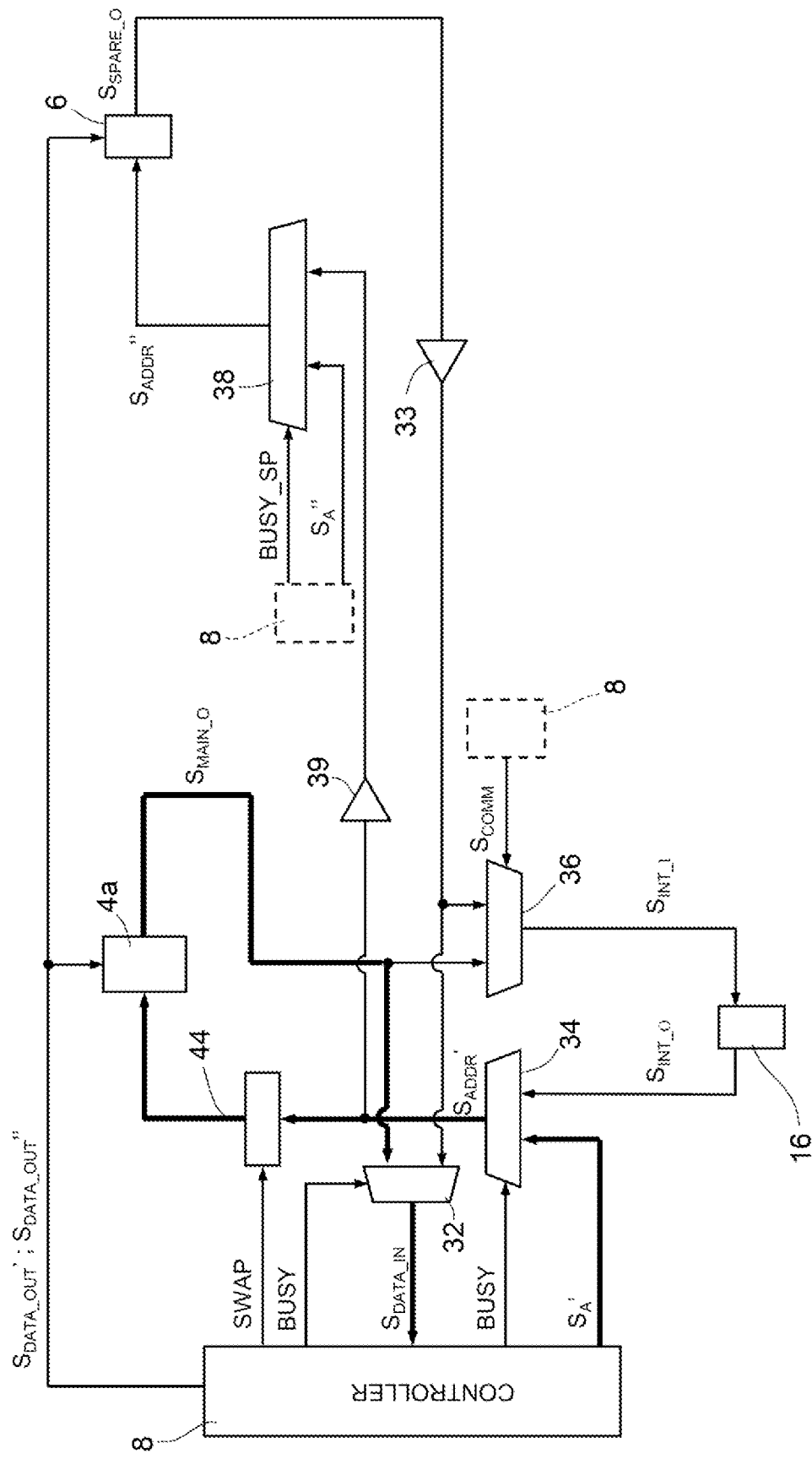
FIGS. 4A-4E show the circuit of FIG. 3 in respective steps of the method of FIG. 2, where circuit connections of particular importance for implementation of the respective step of the method are highlighted by thick lines, according to an embodiment of the present invention.
Figure 4B:
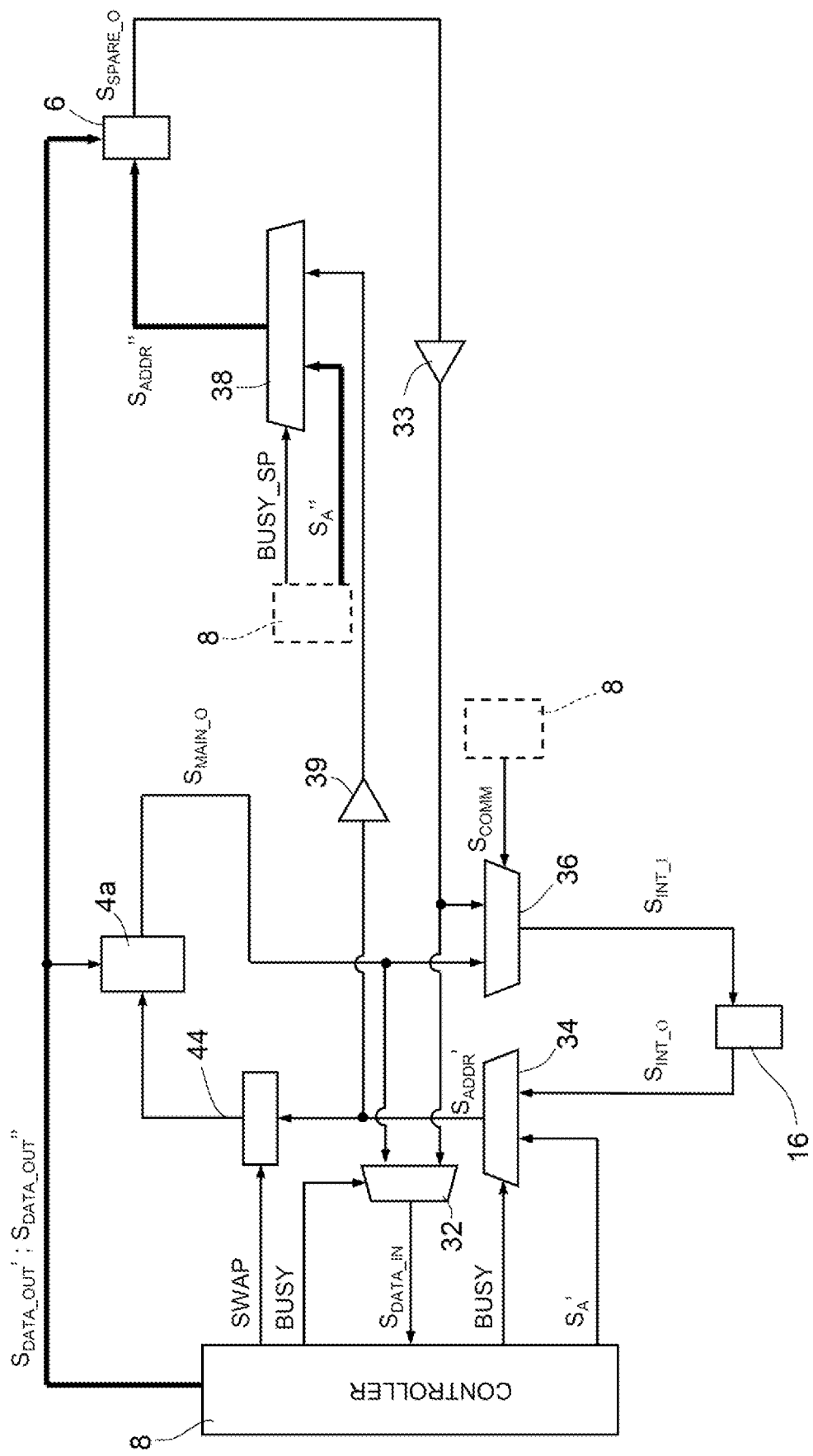

In particular, FIGS. 4A and 4B regard step 22 of the method, where the first datum A1 is written in the auxiliary memory module 6.

In even greater detail, FIG. 4A regards a first sub-step of step 22, where the controller 8 reads the datum A1 from the main memory module 4a. In the course of the sub-step of FIG. 4A, the controller 8 generates the first control signal BUSY so as to select the signals $S_{MAIN\_O}$ and $S_A'$, which are thus supplied at output by the respective multiplexers 32, 34, respectively, via the signals $S_{DATA\_IN}$ and $S_{ADDR}'$. In this way, the controller 8 receives at input the signal $S_{DATA\_IN}$, corresponding to the datum A1, contained in the memory cell addressed by the signal $S_A'$ and contained in the main memory module 4a.

In the course of the sub-step of FIG. 4A, the control signal SWAP has logic value "0," so that the main memory module 4a will receive the unaltered signal $S_{ADDR}'$, which thus corresponds to the signal $S_A'$.

FIG. 4B regards a second sub-step of step 22 of the method, after the first sub-step of FIG. 4A, where the controller 8 writes in the auxiliary memory module 6 the datum A1 read in the course of the sub-step of FIG. 4A.

In the course of the sub-step of FIG. 4B, the controller 8 generates the second control signal BUSY_SP so as to select the signal $S_A''$, which is then supplied at output by the multiplexer 38 via the signal $S_{ADDR}''$. Furthermore, the controller 8 sends to the auxiliary memory module 6 the output signal $S_{DATA\_OUT}''$, which contains the datum A1 to be written in the memory cell of the auxiliary memory module 6 addressed by the signal $S_{ADDR}''=S_A''$. The signal $S_A''$ supplied by the controller 8 in the course of the sub-step of FIG. 4B contains the same address contained in the signal $S_A'$ supplied by the controller 8 in the course of the sub-step of FIG. 4A.

Consequently, at the end of the sub-step of FIG. 4B, the datum A1 is stored in the auxiliary memory module 6 at the same address as the one to which it is associated in the main memory module 4a.

It is evident that the second datum A2 is read from the second main memory module 4b and written in the auxiliary memory module 6 as has been described with reference to the first datum A1 and to the first main memory module 4a and illustrated in FIGS. 4A and 4B.

Figure 4C:
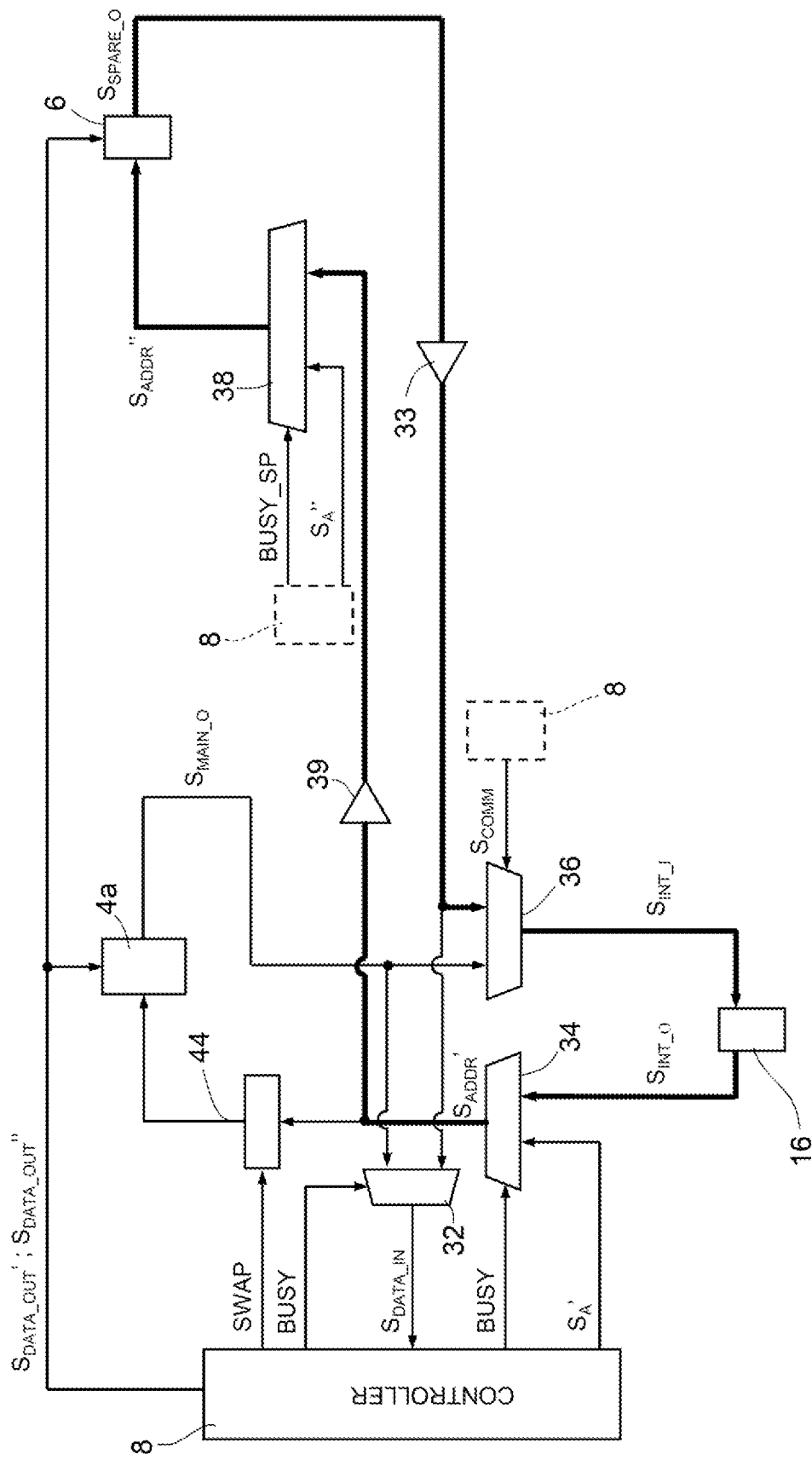
Figure 4D:
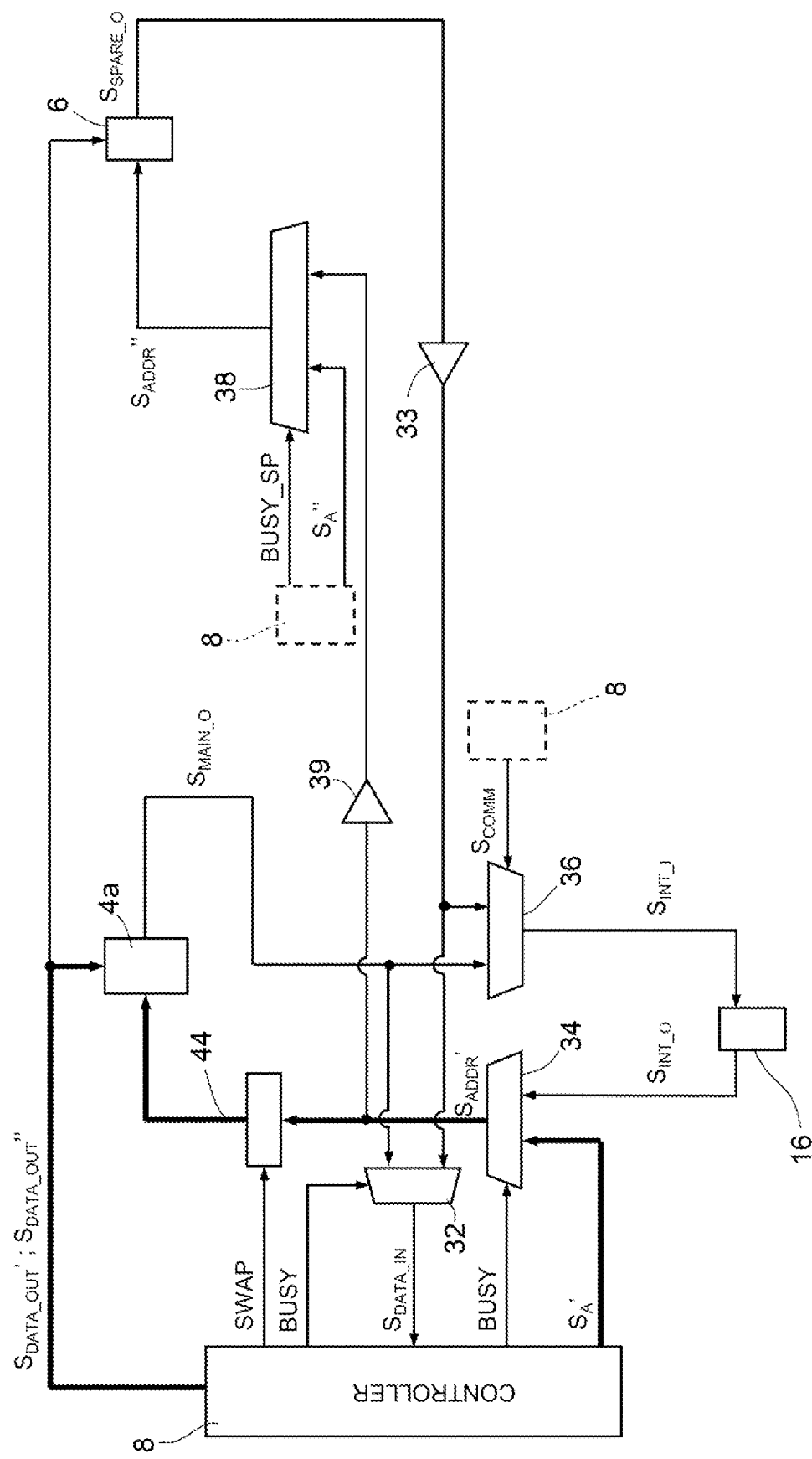

FIGS. 4C and 4D regard step 24 of the method, where the datum Bin is written in the first main memory module 4a, and requests of reading of the datum A1 by the user are re-addressed to the auxiliary memory module 6.

In particular, FIG. 4C illustrates an operation of reading by the user of an informative content of the main memory module 4a, re-addressed to the auxiliary memory module 6.

During step 24, the controller 8 generates the second control signal BUSY_SP so as to select the signals $S_{INT\_O}$, $S_{ADDR}'$, which are thus supplied at output by the respective multiplexers 34, 38. In addition, the controller 8 generates the third control signal $S_{COMM}$ so as to select the signal $S_{SPARE\_O}$, supplied at output by the multiplexer 36. In this way, whenever during step 24 the user asks to read the datum A1, associated to the memory cell of the main memory module 4a addressed by the signal $S_{INT\_O}$, the datum contained in the memory cell of the auxiliary memory module 6 addressed by the signal $S_{ADDR}''=S_{ADDR}'=S_{INT\_O}$ is read. This datum, supplied at output by the auxiliary memory module 6 via the signal $S_{SPARE\_O}$, is then sent to the memory-array interface 16 via the signal $S_{INT\_1}$.

FIG. 4D illustrates a sub-step of writing of the datum Bin in the second submodule 4a'' of the main memory module 4a, carried out during step 24, after the sub-step of FIG. 4C.

The datum B1n is, for example, supplied to the controller 8 by the controller interface 14 of FIG. 1.

During the sub-step of FIG. 4D, the controller 8 generates the first control signal BUSY so as to select the signal $S_A'$, which is then supplied at output by the multiplexer 34 so as to indicate the address of writing of the datum Bin. For instance, writing address of the datum Bin may point to the second submodule 4a'' of the first main memory module 4a. In this case, the logic value of the control signal SWAP is "0." Alternatively, the writing address of the datum Bin may point to the first submodule 4a' of the first main memory module 4a. In this case, the logic value of the control signal SWAP is "i" and consequently, after applying the fixed offset to the signal $S_{ADDR}'$ at output from the address-management block 44, the datum Bin is in any case written in the second submodule 4a''.

It is evident that step 26 of the method, where the datum B2n is written in the second main memory module 4b and requests of reading of the datum A2 by the user are re-addressed to the auxiliary memory module 6, is carried out in a way similar to what has been illustrated in FIGS. 4C and 4D with reference to the datum B1n, to the datum A1, and to the first main memory module 4a.

Figure 4E:
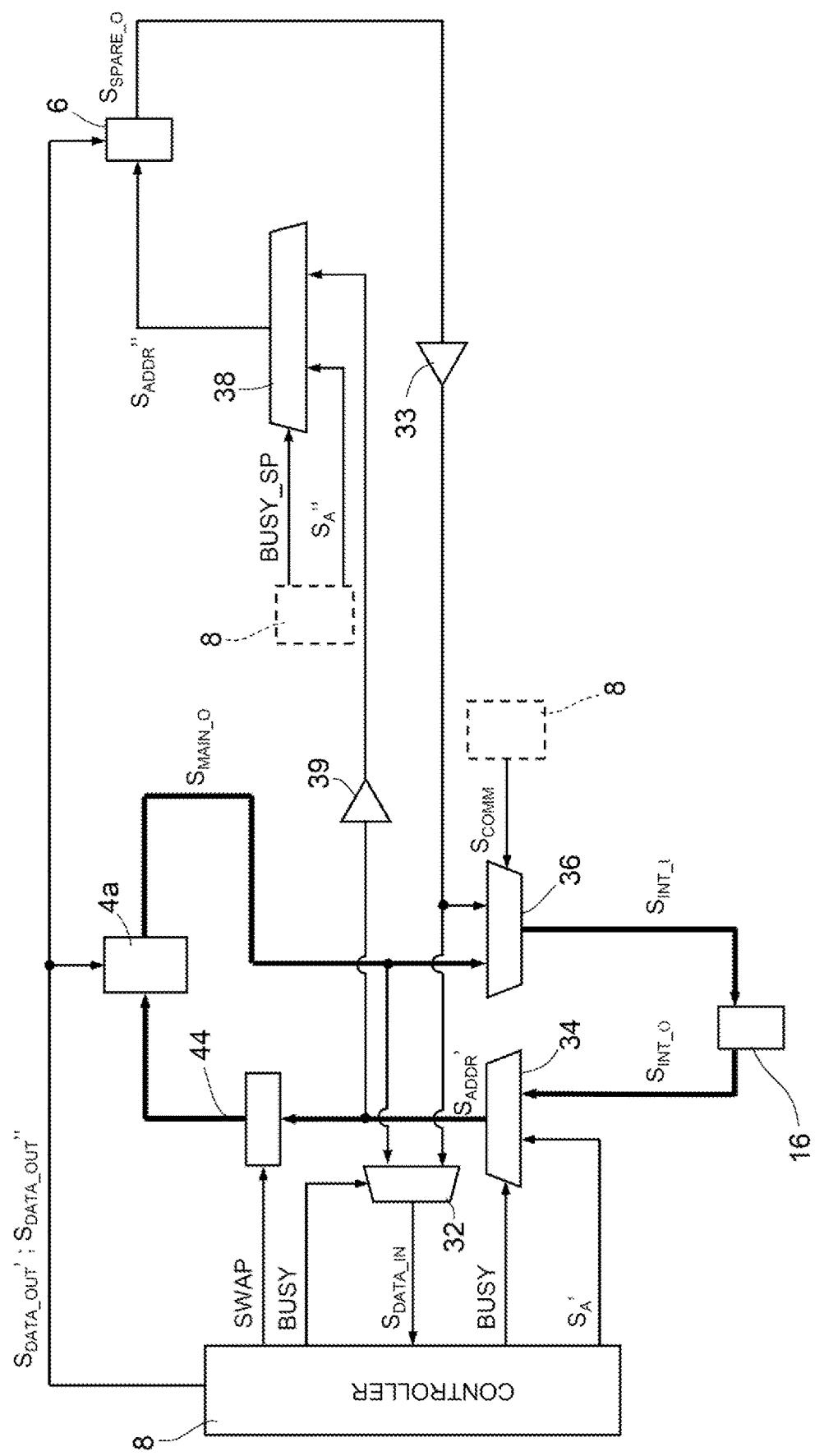

FIG. 4E regards step 28 of the management method, where the user may access the set of data A (for example, the first vehicle-control software) or alternatively the set of data B (in this example, the second vehicle-control software). In particular, FIG. 4E illustrates an operation of reading by the user of an informative content of the first main memory module 4a.

During step 28, the controller 8 controls the multiplexers 34 and 36 so as to select and supply at output, respectively, the signals $S_{INT\_O}$ and $S_{MAIN\_O}$. In this way, in the case where during step 28 the user requests reading of the informative content of the main memory module 4a associated to the memory cell addressed by the signal $S_{INT\_O}$, the datum A1 is read if the control signal SWAP has logic value "0," and the datum Bin is read if the control signal SWAP has logic value "1." Consequently, in the case where the user has to use the first control software, the control signal SWAP has logic value "0." Otherwise, the control signal SWAP has logic value "1." In any case, the datum read, supplied at output by the first main memory module 4a via the signal $S_{MAIN\_O}$, is sent to the memory-array interface 16 via the signal $S_{INT\_I}$.

Figure 5:
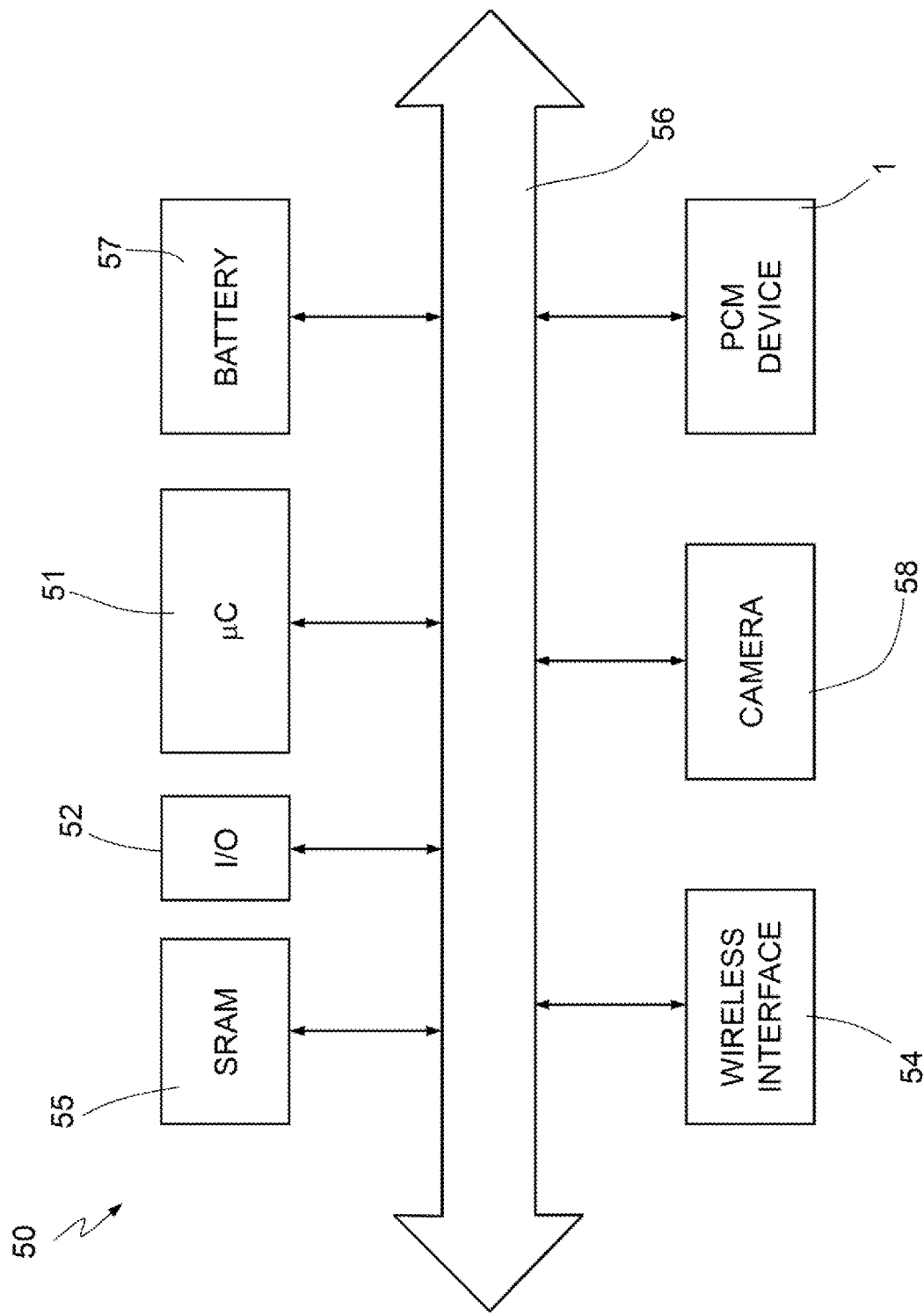
FIG. 5 shows an electronic system that includes the nonvolatile-memory device of FIG. 1, according to an embodiment of the present invention.

FIG. 5 illustrates a portion of an electronic system 50 according to an embodiment of the present invention. The electronic system 50 may be used in electronic devices, such as: an electronic control unit of a vehicle; a PDA (Personal Digital Assistant); a portable or fixed computer, possibly with capacity of wireless data transfer; a mobile phone; a tablet; a smartphone; a digital audio player; a photographic or video camera; or further devices that are able to process, store, transmit, and receive information.

In detail, the electronic system 50 comprises a controller 51 (for example, provided with a microprocessor, a DSP, or a microcontroller) and the nonvolatile-memory device 1 described previously. Optionally, the electronic system 50 comprises one or more from among an input/output device 52 (for example, provided with a keypad and a display) for input and display data, a wireless interface 54, for example, an antenna for transmitting and receiving data through a radio-frequency wireless-communication network, and a RAM 55, all coupled through a bus 56. A battery 57 may be used as electrical supply source in the electronic system 50, which may further be provided with a photographic or video camera 58.

According to a further embodiment (not illustrated in the figures), the nonvolatile-memory device 1 may be embedded in the controller 51.

In any case, embodiments of the present invention find application in an operating condition where the electronic system 50 is controlled by the first control software, and the second control software is written in the nonvolatile-memory device 1, without interrupting execution of the first control software.

For instance, writing of the second control software is carried out using over-the-air methodology.

From an examination of the characteristics of embodiments of the present invention described and illustrated herein, the advantages that it affords are evident.

In particular, in some embodiments, the user has an uninterrupted access in reading to the informative content of the set of data A during writing of the set of data B, and further, at the end of writing of the set of data B, may access alternatively the set of data A or the set of data B without any need to provide an additional memory module dedicated to storage of the set of data B. Consequently, it is possible to store twice the amount of the data as compared to differential memories of a conventional type and having the same amount of main memory modules.

Furthermore, it is possible to execute a software corresponding to the set of data B compiled and linked as if it physically resided in the memory region occupied by the set of data A. In this way, there is no need to specify in an image of the software, contained in the set of data B, its physical location in the memory. In particular, in a context where a number of versions of the software are tested, typically the sequence of updates of the versions of the software is not foreseeable, thus rendering not possible specification of the physical location of the respective images in the memory.

Additionally, it is clear that modifications and variations may be made to the disclosure described and illustrated herein, without thereby departing from the scope of the present invention.

For instance, the method of management of the nonvolatile-memory device 1 envisages operations of refreshing of the data contained in the memory array 2, for example between step 26 and step 28 and/or between step 20 and step 22 and/or in any other moment, according to the need. In this case, access in reading to the informative content associated to the datum during refresh is guaranteed by a method implemented by the controller 8 that envisages the steps of: copying the datum to be refreshed in the auxiliary memory module 6; carrying out the aforementioned refresh of the datum in the memory array 2; and reading the informative content from the auxiliary memory module 6, during the step of refresh, and from the memory array 2, otherwise.

Consequently, refresh is carried out in a way transparent for the user, which has an uninterrupted access in reading and writing to the informative content of the entire nonvolatile-memory device, enabling use thereof for real-time applications.

Figure 6:
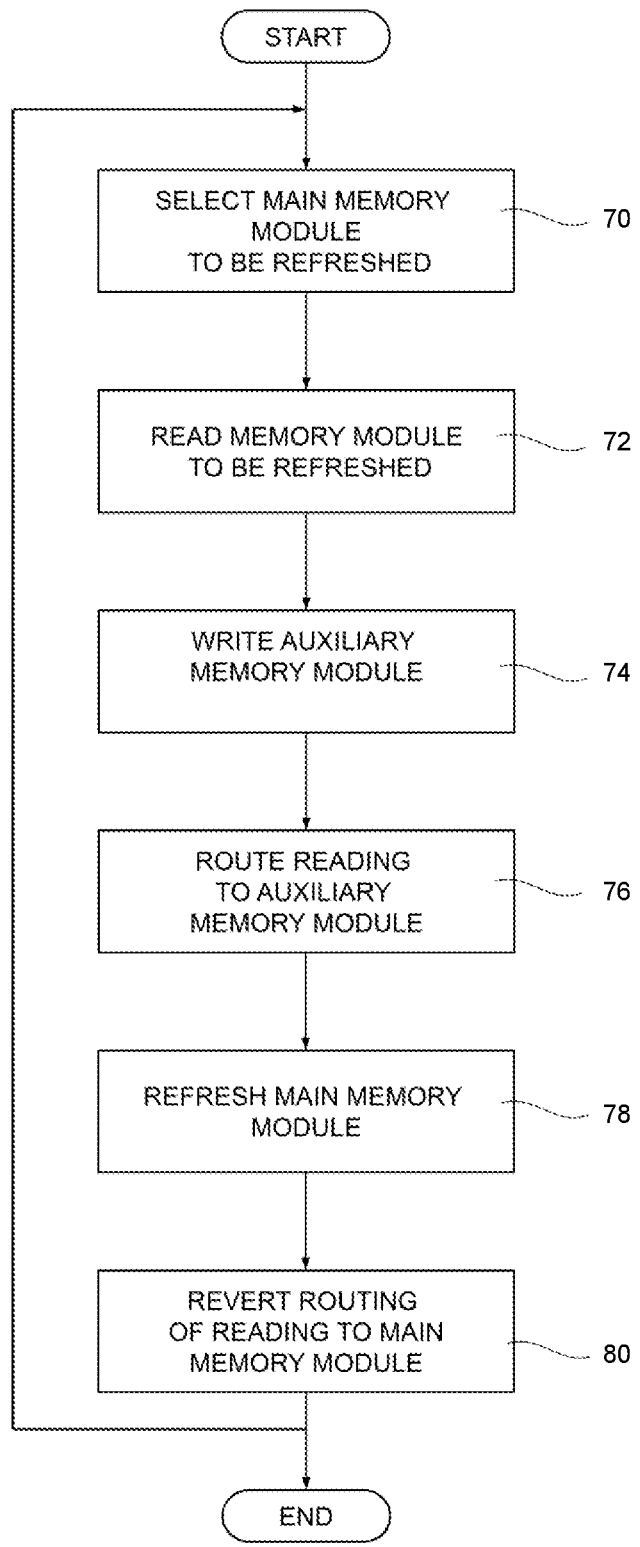
FIG. 6 shows schematically, by a block diagram, a method for refresh of the nonvolatile-memory device of FIG. 1, according to an embodiment of the present invention.

FIG. 6 illustrates schematically, by a block diagram, a method of refresh of the memory array 2, according to an embodiment of the present invention. The method of FIG. 6 may be performed, e.g., between steps 20 and 22, and/or between steps 28 and 30, and/or after step 30.

The refresh method first of all comprises the step 70 of selection of a main memory module 4a-4n to be refreshed. By way of example, in the course of step 70 the main memory module 4a is selected.

Step 70 is followed by step 72, where the controller 8 reads the data contained in the main memory module 4a selected in step 70. In particular, step 72 is performed in a way transparent for the user of the nonvolatile-memory device 1, which may request reading operations by addressing any cell of any main memory module 4a-4n. In the case where the user requests access to the main memory module 4a simultaneously to step 72, there occurs a temporary conflict that has a negligible impact upon the reading times. In particular, when the user has access in reading to the main memory module 4a, a control signal READY assumes the logic value "0"; at the end of reading, the control signal READY assumes the logic value "1." The controller interface 14 has access to the control signal READY. If in the course of step 72 the value of the control signal READY is "0" (i.e., reading by the user is in progress), the controller interface 14 postpones the reading operation to the end of the reading operation of the user, and sets the control signal READY to the value "0" up until the end of its own reading operation. If, in the course of step 72, the value of the control signal READY is "1" (i.e., a reading access to the main memory module 4a by the user is not in progress), the controller interface 14 sets the control signal READY at the value "o" up until the end of its own reading operation so that the user may not gain access during the reading operation and thus conflicts are prevented. In any case, at the end of its own reading operation, the controller interface 14 sets the control signal READY to the logic value "1".

Step 72 is followed by step 74, where the controller 8 writes in the auxiliary memory module 6 the data read in step 72. In particular, the entire contents of the main memory module 4a are copied into the auxiliary memory module 6. For this purpose, it could be necessary to reiterate in a number of cycles the succession of steps 72 and 74 up to copying of the entire contents. Furthermore, in order to preserve the consistency of the data contained in the memory array 2, the controller 8 prevents in this step execution of operations of writing in the memory array 2.

Step 74 is followed by step 76, where requests by the user for reading the information content of the main memory module 4a are re-addressed to the auxiliary memory module 6.

Step 76 is followed by step 78, where the content of the main memory module 4a is physically refreshed, i.e., its content is read and overwritten. According to an aspect of the present invention, during step 78 the user may access the auxiliary memory module 6 in order to read the content thereof, which, as has been said, corresponds to the information content of the main memory module 4a.

In this way, the user has an uninterrupted access to the information content of the entire memory array 2, enabling use thereof for real-time applications.

Step 78 is followed by step 80, where requests for reading the contents of the main memory module 4a, previously re-addressed to the auxiliary memory module 6 in step 76, are again addressed to the main memory module 4a.

Following upon step 80, it is possible to return to step 70 in order to select a new main memory module 4a-4n to be refreshed. For instance, the controller 8 may select periodically and in a sequential way each main memory module 4a-4n according to pre-set time intervals. In particular, these time intervals have a duration compatible with the retention time of each memory cell of the nonvolatile-memory device 1 so as to enable an uninterrupted use of the single-ended mode of the memory array 2. In particular, the retention time of a memory cell is the duration that elapses between writing of a logic datum in the cell and the instant when the datum is no longer readable in so far as it is excessively degraded.

Figure 7:
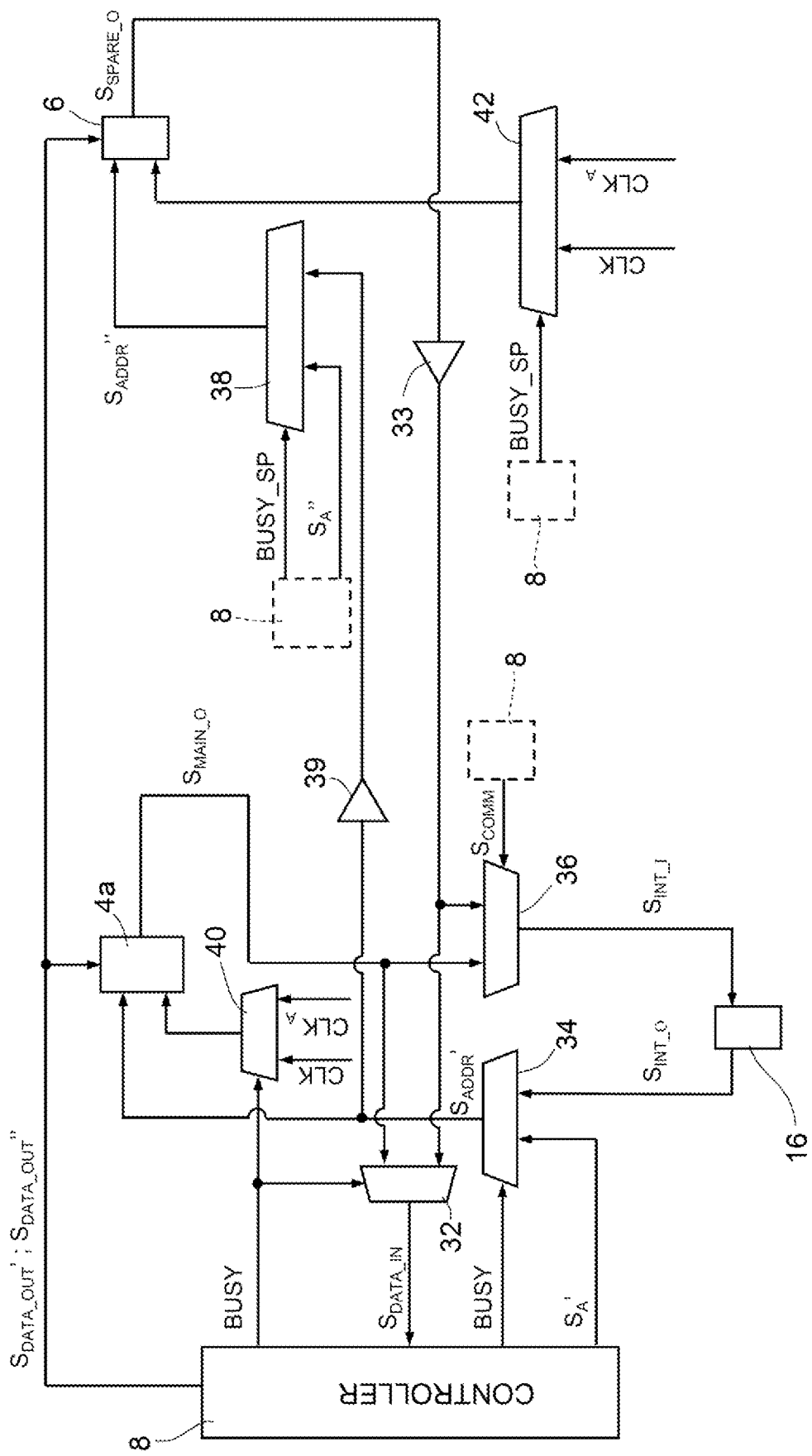
FIG. 7 shows an electrical circuit corresponding to a portion of the nonvolatile-memory device of FIG. 1, included in the portion of FIG. 1, according to an embodiment of the present invention.

FIG. 7 shows in greater detail a portion of the nonvolatile-memory device 1 of FIG. 1, comprising the main memory module 4a, the auxiliary memory module 6, the controller 8, and the memory-array interface 16. In particular, the nonvolatile-memory device 1 further comprises a plurality of multiplexers designed to render transparent the refresh operation for the user of the nonvolatile-memory device 1.

The controller 8 is further configured to generate a first control signal BUSY, a second control signal BUSY_SP, and a third control signal $S_{COMM}$ for controlling the plurality of multiplexers described more fully hereinafter.

The controller 8 is further configured to receive data contained in the main memory module 4a and in the auxiliary memory module 6 via an input signal $S_{DATA\_IN}$. In particular, the signal $S_{DATA\_IN}$ is one of the signals $S_{MAIN\_O}$ (which carries the data contained in the main memory module 4a) and $S_{SPARE\_O}$ (which carries the data contained in the auxiliary memory module 6) that are selected via a multiplexer 32 controlled by the first control signal BUSY. For this purpose, the multiplexer 32 is coupled to the main memory module 4a and to the auxiliary memory module 6 for receiving, respectively, the signal $S_{MAIN\_O}$ and the signal $S_{SPARE\_O}$. For instance, the signal $S_{SPARE\_O}$ is read following upon an operation of writing of the auxiliary memory module 6, in order to verify that the writing operation has been carried out correctly. Otherwise, according to known procedures, subsequent writing operations are carried out.

In particular, the multiplexer 32 is coupled to the auxiliary memory module 6 via interposition of a first buffer 33 so as to reduce the propagation times associated to the auxiliary memory module 6.

The controller 8 is further configured to: send to the main memory module 4a an output signal $S_{DATA\_OUT}'$ that carries data read from the main memory module 4a so as to implement step 78 of the method of FIG. 6; and send to the auxiliary memory module 6 an output signal $S_{DATA\_OUT}''$, which carries data read from the main memory module 4a so as to implement step 74 of the method of FIG. 6.

The controller 8 is further configured to generate a signal $S_A'$, which contains an address of one of the memory cells of the main memory module 4a. The signal $S_A'$ is supplied to an input of a multiplexer 34 controlled by the first control signal BUSY. The multiplexer 34 further receives a signal $S_{INT\_O}$ from the memory-array interface 16, which contains an address for carrying out a writing operation of a conventional type of one of the memory cells of the main memory module 4a. The first control signal BUSY enables selection of one of the input signals $S_A'$, $S_{INT\_O}$ in order to generate a signal $S_{ADDR}'$ at output from the multiplexer 34, according to whether it is executing the refresh method of FIG. 6 or a writing operation of a conventional type.

The signal $S_{ADDR}'$ is supplied to the main memory module 4a for addressing one of the memory cells of the main memory module 4a so as to implement one of steps 74 and 78 of the refresh method of FIG. 6.

Consequently, the signal $S_{MAIN\_O}$ at output from the main memory module 4a contains data corresponding to the data contained in the memory cell of the main memory module 4a addressed by the signal $S_{ADDR}'$.

The signal $S_{MAIN\_O}$ is further supplied to a multiplexer 36 controlled by the third control signal $S_{COMM}$. The multiplexer 38 further receives at input the signal $S_{SPARE\_O}$ from the auxiliary memory module 6 via interposition of the first buffer 33. The multiplexer 38 selects one of the signals $S_{MAIN\_O}$, $S_{SPARE\_O}$ to generate a signal $S_{INT\_I}$ at input to the memory-array interface 16. The signal $S_{INT\_I}$ consequently contains data sent in response to reading requests from the user. These data come from the main memory module 4a or, during a refresh thereof, from the auxiliary memory module 6.

The controller 8 is further configured to generate a signal $S_A''$, containing an address of one of the memory cells of the auxiliary memory module 6. The signal $S_A''$ is supplied to an input of a multiplexer 38 controlled by the second control signal BUSY_SP. The multiplexer 38 further receives at input the signal $S_{ADDR}'$ via interposition of a second buffer 39 so as to reduce the propagation times associated to the auxiliary memory module 6. The second control signal BUSY_SP enables selection of one of the input signals $S_A''$, $S_{ADDR}'$ in order to generate a signal $S_{ADDR}''$ at output from the multiplexer 38. In particular, the output signal $S_{ADDR}''$ corresponds to the input signal $S_A''$ in the course of copying of the data of the main memory module 4a into the auxiliary memory module 6 (step 74 of the refresh method of FIG. 6), and to the input signal $S_{ADDR}'=S_{INT\_O}$ in the case where the user requests reading of the information content of the memory cell 4a in the course of refresh of the main memory module 4a (step 78 of the refresh method of FIG. 6).

The controller 8 is further configured to supply a multiplexer 40 with a clock signal CLK generated by a clock generator (not shown in FIG. 7). The multiplexer 40 further receives at input a clock signal CLKA (generated by another clock generator not shown in FIG. 7), which represents the standard operating clock of the main memory module 4a. The multiplexer 40 is controlled by the first control signal BUSY so as to generate an output signal used as clock of the main memory module 4a by selecting the signal CLK at output from the controller 8, during refresh of the main memory module 4a, and the signal CLKA, otherwise.

The clock signal CLK at output from the controller 8 is further supplied to a multiplexer 42 controlled by the second control signal BUSY_SP. The multiplexer 42 further receives at input the clock signal CLKA. The multiplexer 42 generates an output signal used as clock of the auxiliary module 6 by selecting the signal CLK, during copying of the data of the main memory module 4a into the auxiliary memory module 6 (step 74 of the refresh method of FIG. 6), and the signal CLKA, in the case where the user requests reading of the information content of the memory cell 4a during refresh of the main memory module 4a (step 78 of the refresh method of FIG. 6).

It is evident that the other main memory modules 4b-4n are structurally equivalent to the main memory module 4a of FIG. 7, and are operatively coupled to the controller 8, to the auxiliary memory module 6, and to the memory-array interface 16 via respective multiplexers. Furthermore, each main memory module 4a-4n may be associated to a respective clock signal, for example different from the clock signal of the other main memory modules. In other words, each main memory module 4a-4n may operate asynchronously with respect to the others, and send respective address signals and clock signals at input to the multiplexers 38 and 42, respectively.

In particular, each clock signal may have a frequency of its own different from the frequency of the other clock signals. Consequently, the auxiliary module 6 may be controlled for operating according to the synchronism of each clock signal and thus to the respective frequencies so as to replicate the operation of the main memory module during refresh.

As shown in FIG. 7, in some embodiments, the auxiliary memory module 6 used to perform the method of FIG. 6 is the same as the auxiliary memory module used to perform the method of FIG. 2. Some embodiments may perform the method of FIG. 6 using an auxiliary memory that is different from the auxiliary memory used to perform the method of FIG. 2. In such embodiments, the method of FIG. 6 may be performed, e.g., between steps 20 and 22, and/or between steps 22 and 24, and/or between steps 24 and 26, and/or between steps 26 and 28, and/or between steps 28 and 30, and/or after step 30.

In order to describe in greater detail some steps of the refresh method of FIG. 6, each of FIGS. 8A-8E shows the portion of the nonvolatile-memory device 1 of FIG. 7 during a different step of the method, according to an embodiment of the present invention. In each of FIGS. 8A-8E, communication lines corresponding to signals that are active in the corresponding step of the method are highlighted with the use of thick lines, where by "active signals" are meant signals that carry data during the step, signals that carry addresses to the data, and clock signals designed to time the data transport.

Figure 8A:
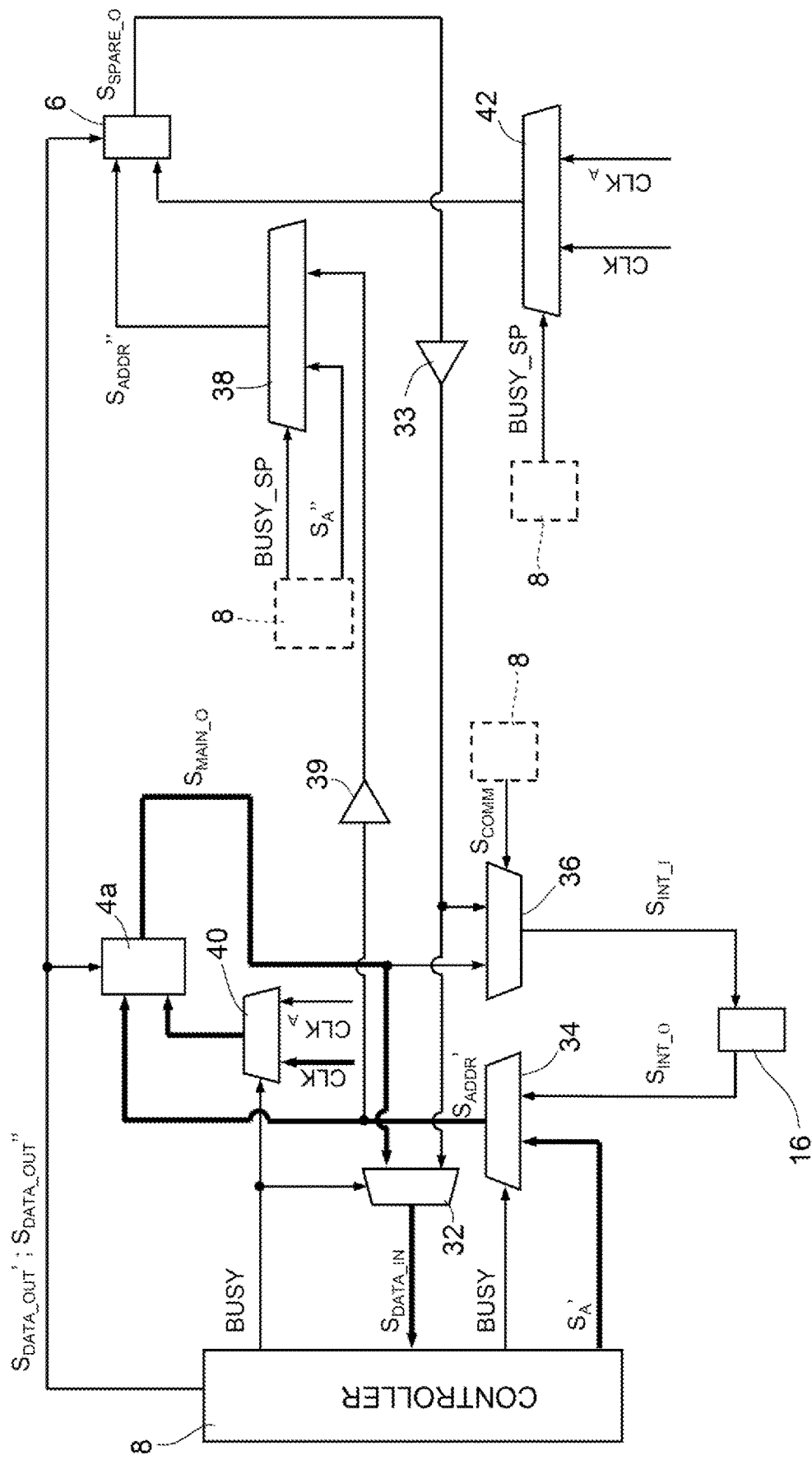
FIGS. 8A-8E show the circuit of FIG. 7 in respective steps of the method of FIG. 6, where circuit connections of particular importance for implementation of the respective step of the method are highlighted by thick lines, according to an embodiment of the present invention.

In particular, FIG. 8A regards step 72 of the method, where the controller 8 reads the data contained in the main memory module 4a.

During Step 72, the controller 8 generates the first control signal BUSY so as to select the signals $S_{MAIN\_O}$, $S_A'$, and CLK, which are thus supplied at output by the respective multiplexers 32, 34, 40. In this way, the controller 8 receives at input the signal $S_{DATA\_IN}$, corresponding to the datum contained in the memory cell that is addressed by the signal $S_A'$ and is contained in the main memory module 4a. The controller 8 is configured to read in this way all the data contained in the main memory module 4a varying the address carried by the signal $S_A'$.

Figure 8B:
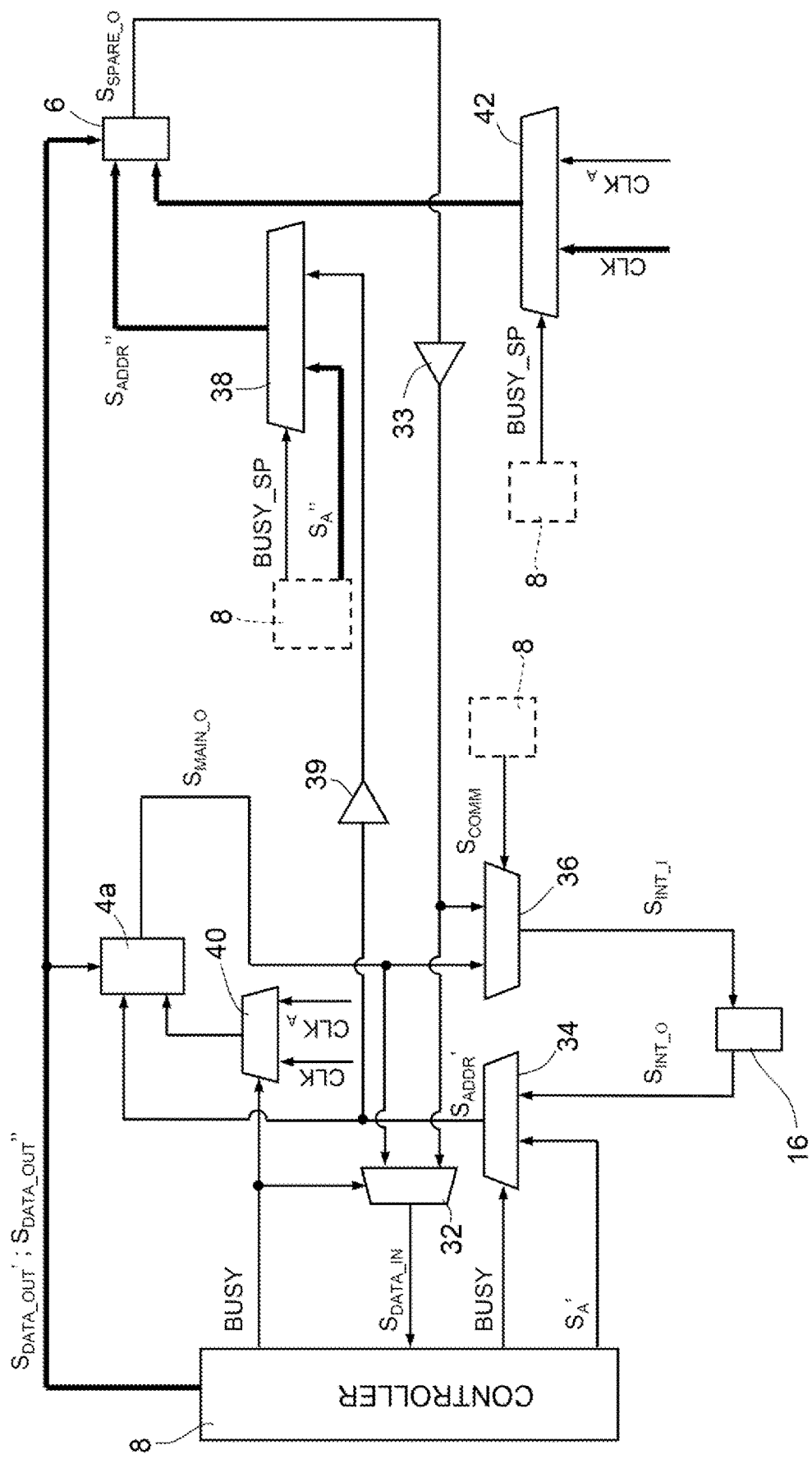

FIG. 8B regards step 74 of the method, where the controller 8 writes in the auxiliary memory module 6 the data read during step 72.

During step 74, the controller 8 generates the second control signal BUSY_SP so as to select the signals $S_A''$ and CLK, which are thus supplied at output by the respective multiplexers 38, 42. In addition, the controller 8 sends to the auxiliary memory module 6 the output signal $S_{DATA\_OUT}''$, containing data to be written in the memory cell of the auxiliary memory module 6 addressed by the signal $S_{ADDR}''=S_A''$. The controller 8 is configured to write in this way all the data read previously (step 72) from the main memory module 4a, varying the address carried by the signal $S_A''$.

Figure 8C:
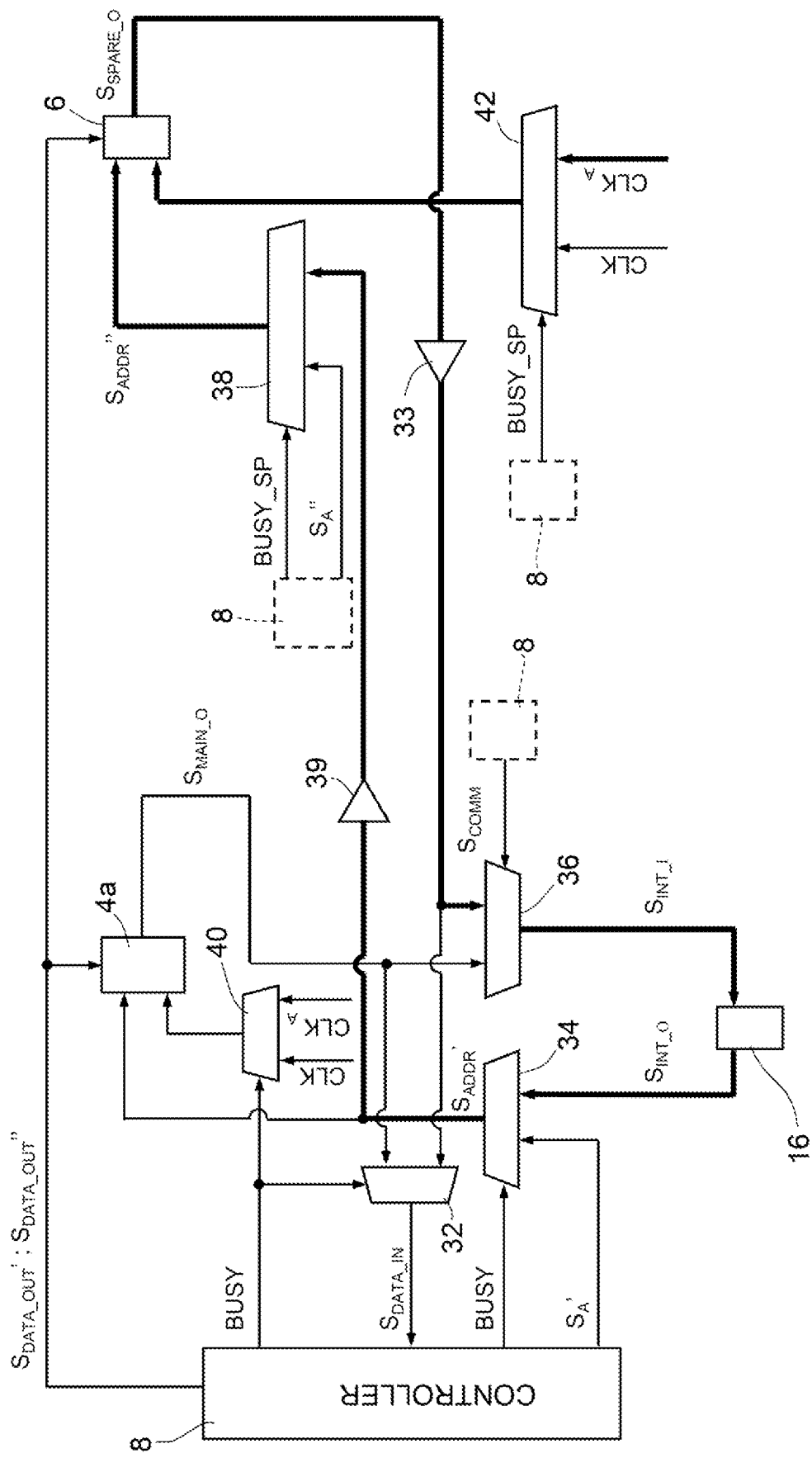

FIG. 8C regards step 76 of the method, and represents an operation of reading by the user of an information content of the main memory module 4a, re-addressed to the auxiliary memory module 6.

In the time interval that elapses from execution of step 76 to start of step 80, the controller 8 generates the second control signal BUSY_SP so as to select the signals $S_{INT\_O}$, $S_{ADDR}'$ and $CLK_A$, which are thus supplied at output by the respective multiplexers 34, 38, 42. Further, the controller 8 generates the third control signal $S_{COMM}$ so as to select the signal $S_{SPARE\_O}$, supplied at output by the multiplexer 36. In this way, whenever in the time interval the user requests reading of the information content of the main memory module 4a associated to the memory cell addressed by the signal $S_{INT\_O}$, the datum contained in the memory cell of the auxiliary memory module 6 addressed by the signal $S_{ADDR}''=S_{ADDR}'=S_{INT\_O}$ is read. The datum, supplied at output by the auxiliary memory module 6 via the signal $S_{SPARE\_O}$, is thus sent to the memory-array interface 16 via the signal $S_{INT\_1}$.

Figure 8D:
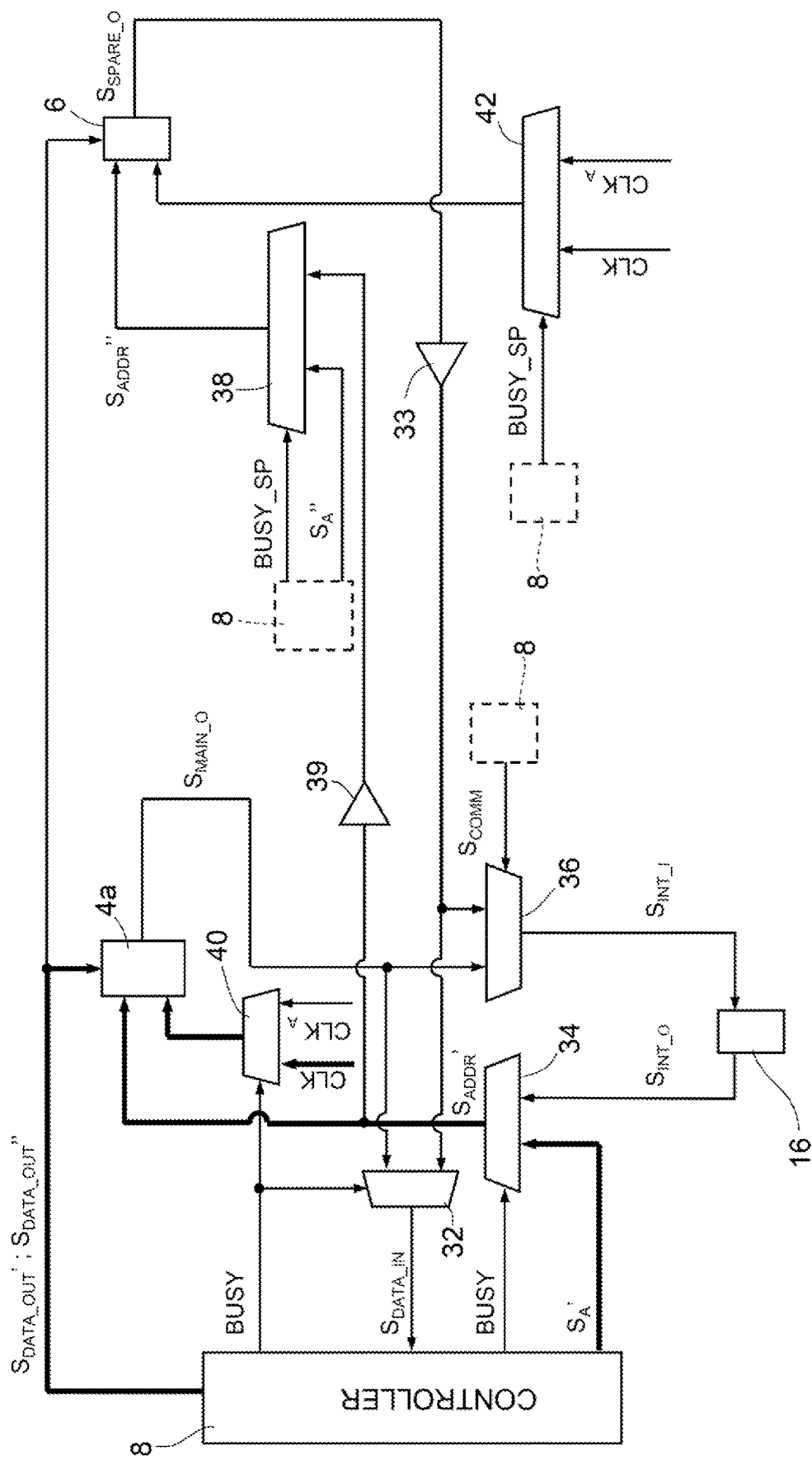

FIG. 8D regards step 78 of the method, where the content of the main memory module 4a is refreshed.

In the course of step 78, in a first sub-step (not illustrated graphically in FIG. 8D), the controller 8 reads the datum of the memory cell of the main memory module 4a addressed by the signal $S_{ADDR}'=S_A'$. For this purpose, as already shown in FIG. 8A for step 72, the controller 8 generates the first control signal BUSY so as to select the signals $S_{MAIN\_O}$, $S_A'$, and CLK, which are thus supplied at output by the respective multiplexers 32, 34, 40.

Following upon reception by the controller 8 of the datum read and carried by the signal $S_{DATA\_IN}$, a second sub-step of step 78, shown in FIG. 8D, is carried out, where the controller 8 continues to generate the first control signal BUSY as in the first sub-step, and further sends to the main memory module 4a the output signal $S_{DATA\_OUT}'$, containing the datum that is read in the first sub-step and is to be physically refreshed via overwriting.

The controller 8 is configured to repeat the first and second sub-steps for each datum contained in the main memory module 4a. In particular, it is possible to carry out in a first time interval the first sub-step for each datum and in a second time interval the second sub-step. Alternatively, it is possible to carry out the second sub-step for one datum immediately after the first sub-step for the same datum, and then pass to the next datum.

Figure 8E:
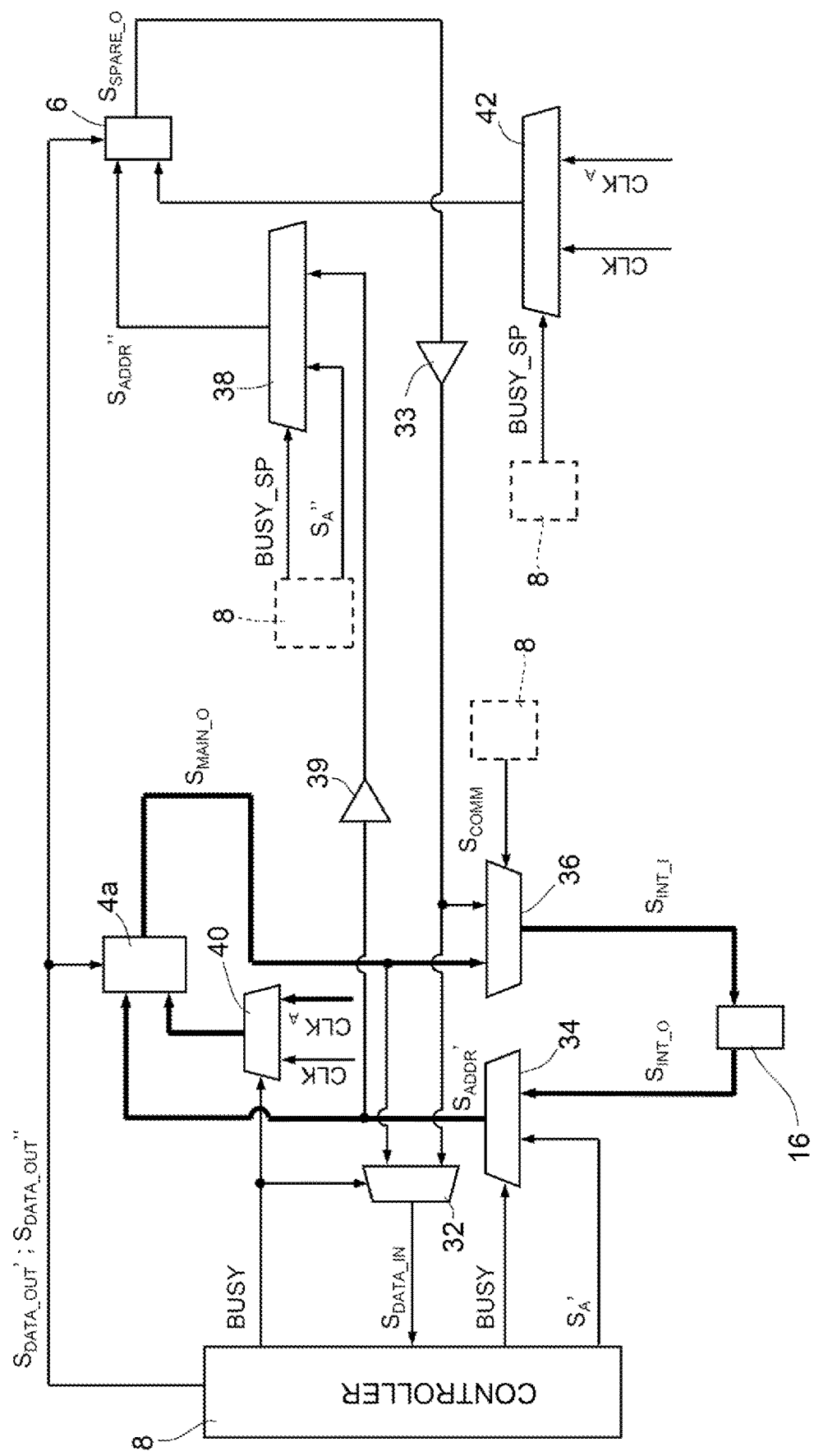

FIG. 8E regards step 80 of the method and illustrates an operation of reading by the user of an information content of the main memory module 4a.

In a time interval that elapses from execution of step 80 up to execution of step 76 of a subsequent iteration of the refresh method of FIG. 6, the controller 8 controls the multiplexers 34, 36, 40 so as to select and supply at output the signals $S_{INT\_O}$, $S_{MAIN\_O}$ and $CLK_A$, respectively. In this way, whenever in the time interval the user requests reading of the information content of the main memory module 4a associated to the memory cell addressed by the signal $S_{INT\_O}$, the datum contained in the memory cell of the main memory module 4a addressed by the signal $S_{ADDR}'=S_{INT\_O}$ is read. This datum, supplied at output by the main memory module 4a via the signal $S_{MAIN\_O}$ is thus sent to the memory-array interface 16 via the signal $S_{INT\_I}$.

In some embodiments, the implementation of the refresh method advantageously enables uninterrupted use of a PCM of a differential type in single-ended mode, and consequently storage of different data in memory cells normally coupled for reading a single datum in differential mode.

In this way, in some embodiments, it is possible to increase the total capacity of a PCM designed for operating in differential mode, without appreciably increasing the size and costs thereof.

Furthermore, in some embodiments, the refresh method is carried out in a way transparent for the user, which has an uninterrupted access in reading and writing to the information content of the entire nonvolatile-memory device, enabling use thereof for real-time applications.

Additionally, it is clear that modifications and variations may be made to the disclosure described and illustrated herein, without thereby departing from the scope of the present invention. For instance, the refresh method may be applied to any memory of a differential type, not necessarily based upon phase-change technology.

Figure 9:
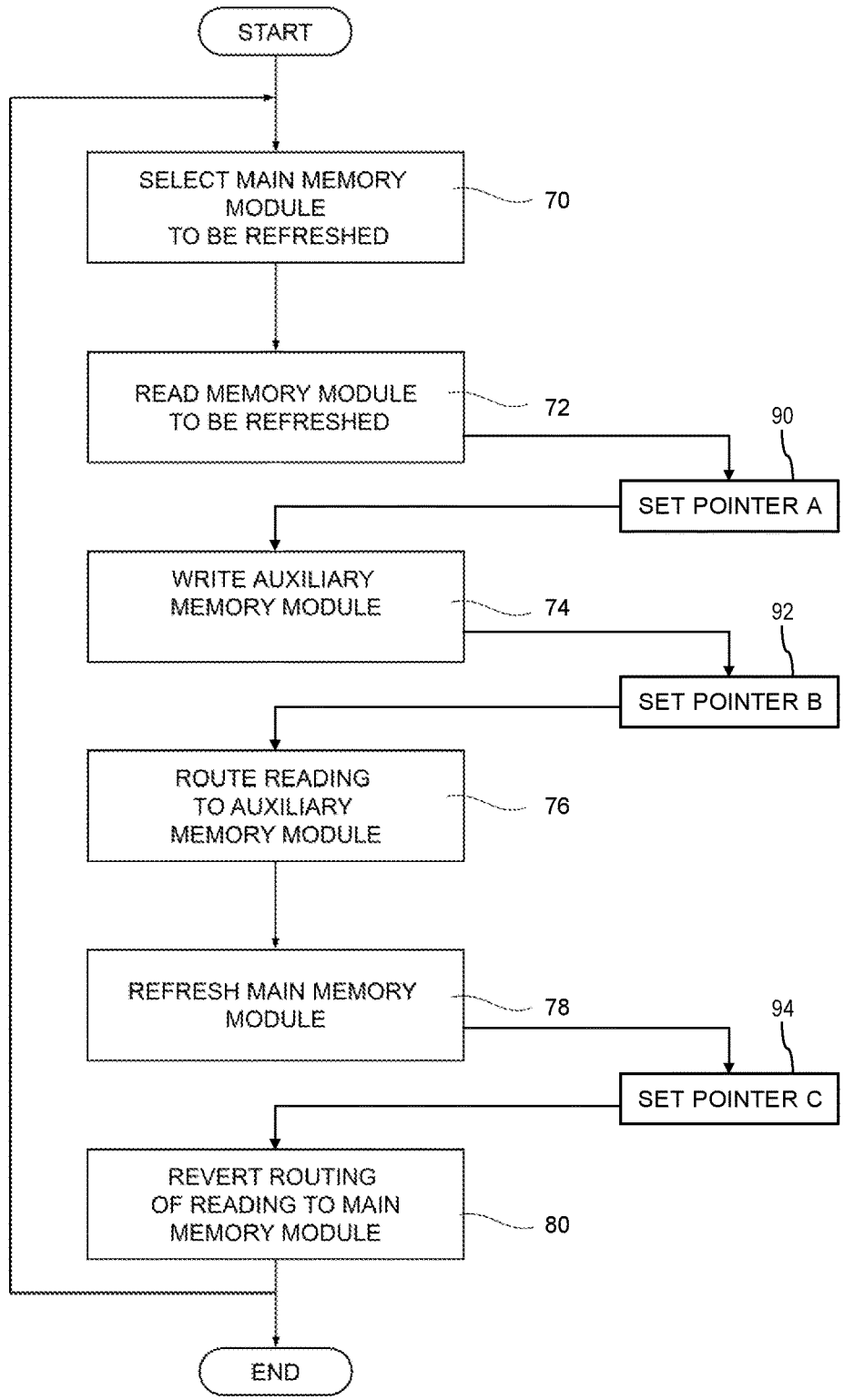
FIG. 9 shows schematically, by a block diagram, a method for refresh of the nonvolatile-memory device of FIG. 1, according to an embodiment of the present invention.
Figure 10:
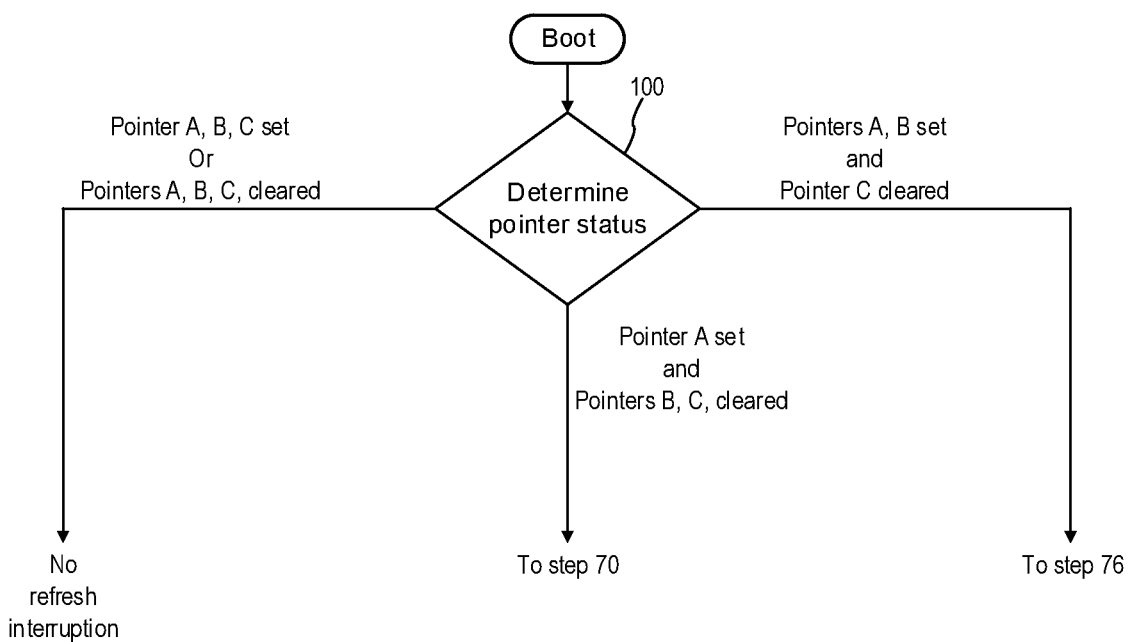
FIG. 10 shows schematically, by a block diagram, a method for memory recovery after an interruption during a refresh of the nonvolatile-memory device of FIG. 1, according to an embodiment of the present invention.

In some embodiments, the memory array implements a recovery method in case the refresh method (e.g., the method of FIG. 6) is aborted, e.g., because of an asynchronous event (e.g., reboot, reset, power off, etc.) abruptly interrupting the refresh sequence. For example, FIG. 9 shows schematically, by a block diagram, a method for refreshing the memory array 2, according to an embodiment of the present invention. FIG. 10 shows schematically, by a block diagram, a method for memory recovery of the memory array 2, according to an embodiment of the present invention. FIGS. 9 and 10 may be understood together.

In the embodiment illustrated in FIG. 9, steps 70, 72, 74, 76, 78, and 80, are performed as described with respect to FIG. 6.

During step 70, pointers A, B, and C are cleared (not set). In some embodiments, pointers A, B, and C are located in auxiliary memory module 6. In some embodiments, pointers A, B, and C may be stored in a different memory location, such as a different auxiliary memory, for example.

During step 90, which is performed after step 72 and before step 74, pointer A is set. During step 92, which is performed after step 74 and before step 77, pointer B is set. During step 94, which is performed after step 78 and before step 80, pointer C is set. In some embodiments, after step 80, pointers A, B, and C, are cleared.

As can be seen from FIG. 9, if an interruption of the memory refresh method occurs, it is possible to determine the status of the memory refresh at the time of interruption based on pointers A, B, C. For example, if after a memory refresh interruption, pointers A, B, and C, are cleared, the memory refresh was interrupted either before step 90 or after step 80. If instead pointer A is set and pointers B, and C, are cleared, the memory refresh was interrupted between step 90 and step 92 (e.g., during step 74). If instead pointers A and B are set and pointer C is cleared, the memory refresh was interrupted between step 92 and step 94 (e.g., during steps 76 or 78). If instead pointers A, B and C are set, the memory refresh was interrupted after step 94 (e.g., during step 80).

In some embodiments, determining at which point the memory refresh method is interrupted is advantageous because it allows for configuring the memory array 2 such that no data is lost. For example, as shown in FIG. 10, in some embodiments, the pointer status is determined during step 100. Step 100 may occur, e.g., immediately after boot (after power-up), or during boot (during power-up) of the memory. In some embodiments, step 100 may be performed after a memory refresh interruption flag is asserted.

If during step 100 it is determined that pointers A, B, and C are all set or all cleared, then the interruption, if any, occurred after the memory module 4a was refreshed (step 80). Thus, read request are addressed to the main memory module 4a and memory array 2 continues operating normally (e.g., the next memory module may be refreshed).

If during step 100 it is determined that pointer A is set and pointers B, and C are cleared, then the interruption occurred before refreshing memory module 4a (step 80) and before writing the auxiliary memory module 6 (step 74). Thus, read request are addressed to the main memory module 4a and memory module 4a is selected to be refreshed (step 70). In some embodiments, a notification is sent to a user (e.g., a microprocessor, a DSP, or a microcontroller) that the memory refresh was not completed.

If during step 100 it is determined that pointers A and B are set and pointer C is cleared, then the interruption occurred before refreshing memory module 4a (step 80) but after writing the auxiliary memory module 6 (step 74). Thus, read request are addressed to the auxiliary memory module 6 (step 76) and step 78 is performed. In some embodiments, a notification is sent to the user that the memory refresh was not completed.

By performing a memory recovery method, such as shown in FIG. 10, some embodiments advantageously allow for avoiding data corruption in the event of an asynchronous interruption of a memory refresh.

Figure 11:
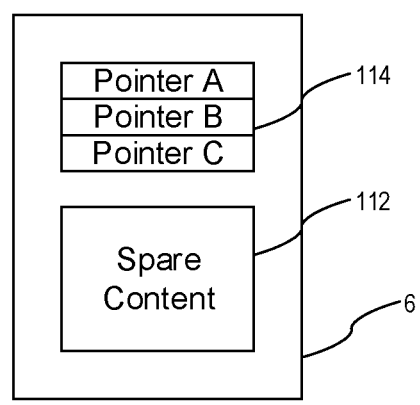
FIG. 11 shows an auxiliary memory module of FIG. 1, according to an embodiment of the present invention.

In some embodiments, the refresh pointers (e.g., A, B, or C) are stored inside auxiliary memory module 6. For example, FIG. 11 shows auxiliary memory module 6, according to an embodiment of the present invention. As shown in FIG. 11, auxiliary memory module 6 includes memory portion 112 and memory portion 114. Memory portion 112 may be used, e.g., for performing the method of FIG. 2 and/or the method of FIG. 6. Memory portion 114 may be used for storing the refresh pointers, e.g., used during steps 90, 92, and 94. In some embodiments, memory portion 114 comprises a plurality of registers, as shown in FIG. 11.

In some embodiments, the memory locations where the refresh pointers are stored are registers having a plurality of bits, e.g., 8, 16, 32, etc. In some embodiments, error correction code (ECC) is used to store the refresh pointers. For example, pointer A may be stored in a first 8-bit register, pointer B may be stored in a second 8-Bit register, and pointer C may be stored in a third 8-bit register.

In some embodiments, each of the refresh pointers may store a first value (e.g., N) to indicate that the pointer is cleared, or a second value (e.g., N+1) to indicate that the pointer is set. Values different than the first and second values are invalid. In this way, some embodiments, may determine that:

pointer A is cleared when it has the first value and is set when it has the second value;

pointer B is cleared when it has the first value and is set when it has the second value; and pointer C is cleared when it has the first value and is set when it has the second value.

In some embodiments, the first and second values are selected such that there is no ambiguity, in case the memory refresh is interrupted during a writing of the refresh pointer into memory portion 114, as to whether the pointer has the first value, the second value, or is invalid. For example, in some embodiments, the first value is equal to 0x55 (b'01010101), and the second value is equal to 0xAA (b'10101010). Other values are also possible.

In some embodiments, a pointer having an invalid value is indicative that the refresh method was aborted during update of the pointer. In some embodiments, thus, an invalid value is interpreted as having the second value (since, e.g., if the memory refresh was aborted during the refresh pointer update, then the previous step was completed successfully). In some embodiments, a pointer having an invalid value is replaced with the second value during boot and before performing step 100.

In some embodiments, the first and second values may also include information about which memory module is being refreshed.

Advantages of some embodiments include allowing for the use of a differential memory (e.g., PCM) in single-ended mode to increase the memory capacity so that, e.g., two different vehicle-control software can be simultaneously stored in the memory so that both software can be evaluated. In some embodiments, the memory retention is extended by the refresh method without comprising real-time operation (since read access is not interrupted during the refresh method). In some embodiments, a recovery method allowed for avoiding corrupted data that may be caused by an abrupt asynchronous event, such as a reboot.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method comprising:
performing a refresh of a main memory module using an auxiliary memory module, wherein performing the refresh of the main memory module comprises:
copying first data from the main memory module to the auxiliary memory module,
after copying the first data from the main memory module to the auxiliary memory module, routing read requests for reading the first data to the auxiliary memory module,
after routing the read requests for reading the first data to the auxiliary memory module, physically refreshing the main memory module,
after physically refreshing the main memory module, routing the read requests for reading the first data to the main memory module, and
capturing a state of the main memory module physical refresh using one or more pointers;
before finishing performing the physical refresh of the main memory module, aborting the main memory module physical refresh; and
after the physical refresh of the main memory module is aborted, determining whether to route the read requests for reading the first data to the main memory module or to the auxiliary memory module based on the one or more pointers.

2. The method of claim 1, wherein the one or more pointers comprises first, second, and third pointers, and wherein capturing the state of the main memory module physical refresh using the one or more pointers comprises:
before copying the first data from the main memory module to the auxiliary memory module, setting the first pointer;
after copying the first data from the main memory module to the auxiliary memory module and before routing the read requests for reading the first data to the main memory module, setting the second pointer; and
after physically refreshing the main memory module, setting the third pointer.

3. The method of claim 2, wherein determining whether to route the read requests for reading the first data to the main memory module or to the auxiliary memory module based on the one or more pointers comprises:
when a state of the first, second, and third pointers is the same, routing the read requests for reading the first data to the main memory module; and
when the first and second pointers are set and the third pointer is cleared, routing the read requests for reading the first data to the auxiliary memory module.

4. The method of claim 2, further comprising, after the physical refresh of the main memory module is aborted and when the first and second pointers are set and the third pointer is cleared:
routing the read requests for reading the first data to the auxiliary memory module;
after routing the read requests for reading the first data to the auxiliary memory module, physically refreshing the main memory module; and
after physically refreshing the main memory module, routing the read requests for reading the first data to the main memory module.

5. The method of claim 1, wherein determining whether to route the read requests for reading the first data to the main memory module or to the auxiliary memory module based on the one or more pointers comprises determining whether to route the read requests for reading the first data to the main memory module or to the auxiliary memory module based on the one or more pointers after booting a memory comprising the main memory module.

6. The method of claim 1, wherein aborting the main memory module physical refresh comprises aborting the main memory module physical refresh in response to a reboot, reset, or power off of a memory comprising the main memory module.

7. The method of claim 1, further comprising storing the one or more pointers in the auxiliary memory module.

8. The method of claim 1, wherein the main memory module is a differential memory module.

9. The method of claim 1, wherein the main memory module comprises a phase-change memory.

10. The method of claim 1, wherein the main memory module is comprised in an electronic system, and wherein the electronic system comprises an electronic control unit of a vehicle, a personal digital assistant (PDA), a notebook, a mobile phone, a smartphone, a tablet, a digital audio player, a photographic camera, or a video camera.

11. A memory comprising:
a main memory module configured to store first logic data to be refreshed;
an auxiliary memory module; and
a controller configured to perform a refresh of the main memory module using the auxiliary memory module by:
copying first data from the main memory module to the auxiliary memory module,
after copying the first data from the main memory module to the auxiliary memory module, routing read requests for reading the first data to the auxiliary memory module,
after routing the read requests for reading the first data to the auxiliary memory module, physically refreshing the main memory module,
after physically refreshing the main memory module, routing the read requests for reading the first data to the main memory module, and
capturing a state of the main memory module physical refresh using one or more pointers,
wherein the controller is further configured to, before finishing performing the physical refresh of the main memory module, abort the main memory module physical refresh and determine, after the physical refresh of the main memory module is aborted, whether to route the read requests for reading the first data to the main memory module or to the auxiliary memory module based on the one or more pointers.

12. The memory of claim 11, wherein the one or more pointers comprises first, second, and third pointers, and wherein the controller is further configured to capture the state of the main memory module physical refresh using the one or more pointers by:
before copying the first data from the main memory module to the auxiliary memory module, setting the first pointer;
after copying the first data from the main memory module to the auxiliary memory module and before routing the read requests for reading the first data to the main memory module, setting the second pointer; and
after physically refreshing the main memory module, setting the third pointer.

13. The memory of claim 12, wherein the controller is further configured to determine whether to route the read requests for reading the first data to the main memory module or to the auxiliary memory module based on the one or more pointers comprises:

when a state of the first, second, and third pointers is the same, routing the read requests for reading the first data to the main memory module; and
when the first and second pointers are set and the third pointer is cleared, routing the read requests for reading the first data to the auxiliary memory module.

14. The memory of claim 12, wherein the controller is further configured to, after the physical refresh of the main memory module is aborted and when the first and second pointers are set and the third pointer is cleared:
route the read requests for reading the first data to the auxiliary memory module;
after routing the read requests for reading the first data to the auxiliary memory module, physically refresh the main memory module; and
after physically refreshing the main memory module, route the read requests for reading the first data to the main memory module.

15. The memory of claim 11, wherein the auxiliary memory module comprises the one or more pointers.

16. The memory of claim 11, wherein the main memory module comprises a differential phase-change memory.

17. A memory comprising:
a main memory module;
an auxiliary memory module;
a controller;
a first multiplexer having a first input coupled to a data output of the main memory module, a second input coupled to a data output of the auxiliary memory module, and an output coupled to the controller;
a second multiplexer having an output coupled to an address input of the main memory module, a first input coupled to the controller, and a second input coupled to a memory array interface;
a third multiplexer having an output coupled to an address input of the auxiliary memory module, a first input coupled to the controller, and a second input coupled to the output of the second multiplexer; and
a fourth multiplexer having a first input coupled to the data output of the main memory module, a second input coupled to the data output of the auxiliary memory module, and an output coupled to the memory array interface, wherein the controller is configured to:
refresh the main memory module using the auxiliary memory module and the first and third multiplexers, and
in response to receiving a request for reading first data during the refresh of the main memory module, provide the first data from the main memory module or from the auxiliary memory module to the memory array interface using the fourth multiplexer.

18. The memory of claim 17, wherein the controller is further configured to control the first and second multiplexers with a first signal, the third multiplexer with a second signal, and the fourth multiplexer with a third signal.

19. The memory of claim 18, further comprising:
a fifth multiplexer having an output configured to provide a clock signal to the main memory module, a first input configured to receive a first clock signal, and a second input configured to receive a second clock signal, wherein the controller is further configured to control the fifth multiplexer with the first signal; and
a sixth multiplexer having an output configured to provide a clock signal to the auxiliary memory module, a first input configured to receive the first clock signal, and a second input configured to receive the second clock signal, wherein the controller is further configured to control the sixth multiplexer with the second signal.

20. The memory of claim 17, further comprising:
a first buffer coupled between the data output of the auxiliary memory module and the second input of the first multiplexer; and
a second buffer coupled between the output of the second multiplexer and the second input of the third multiplexer.

* * * * *